(12) United States Patent
Steffens et al.

(10) Patent No.: US 6,364,088 B1
(45) Date of Patent: Apr. 2, 2002

(54) STORAGE ARRANGEMENT FOR COMPONENTS AND DEVICE COMPRISING SUCH A STORAGE ARRANGEMENT

(75) Inventors: Engelbert Steffens; Jörg Martens, both of Pinneberg (DE)

(73) Assignee: U. S. Philips Corporation, New York, NY (US)

( * ) Notice: Subject to any disclaimer, the term of this patent is extended or adjusted under 35 U.S.C. 154(b) by 0 days.

(21) Appl. No.: 09/585,734

(22) Filed: Jun. 2, 2000

(30) Foreign Application Priority Data

Jun. 5, 1999 (DE) .......................... 199 25 789

(51) Int. Cl.$^7$ ................................ B65G 1/00
(52) U.S. Cl. ................ 198/347.1; 198/778; 193/12
(58) Field of Search ............... 198/347.1, 778; 193/12, 25 FT, 35 S

(56) References Cited

U.S. PATENT DOCUMENTS

| | | | | |
|---|---|---|---|---|
| 2,878,915 A | * | 3/1959 | Judge ...................... | 193/12 |
| 4,501,380 A | * | 2/1985 | Welch ...................... | 193/12 X |
| 5,083,651 A | * | 1/1992 | Wiese ...................... | 193/12 |
| 5,568,850 A | * | 10/1996 | Neber ...................... | 198/347.1 |

FOREIGN PATENT DOCUMENTS

| | | |
|---|---|---|
| DE | 4220700 A1 | 2/1993 |
| EP | 0108401 A2 | 5/1984 |
| FR | 2693178 A1 | 1/1994 |
| GB | 1554170 | 10/1979 |

* cited by examiner

Primary Examiner—James R. Bidwell
(74) Attorney, Agent, or Firm—Steven R. Biren

(57) ABSTRACT

A storage arrangement has a channel for accommodating chip-like electronic components in a predefined order and alignment. Simplified operation is achieved in that the channel between a first and a second end of the storage arrangement is led at least largely along a helical line. A device having such a storage arrangement optionally includes a first sub-assembly for preferably filling the storage arrangement with components and a second sub-assembly for preferably unloading the components, or a combination of the two.

20 Claims, 21 Drawing Sheets

STORAGE ARRANGEMENT FOR COMPONENTS AND DEVICE COMPRISING SUCH A STORAGE ARRANGEMENT

BACKGROUND OF THE INVENTION

The invention relates to a storage arrangement comprising a channel for accommodating chip-like electronic components in predefined order and alignment.

German application laid open to public inspection 42 20 700 discloses a storage arrangement for electronic components, which comprises an, in essence, disc-like body in whose inside is arranged an, in essence, helical channel and an opening as a continuation of the helical channel, so that the channel is connected to the outside of the disc-like body. In the channel of this storage arrangement can be stored electronic components in a predefined order. For feeding the storage arrangement with electronic components, vibrations are applied to the storage arrangement and the components are supplied via a vibrating feeding arrangement. This storage arrangement may be designed such that it can be used as a feeding source for feeding the electronic components to a mounting head of an automatic mounting device for mounting the electronic components on printed circuit boards. For this purpose, the storage arrangement particularly has air supply holes which are connected to an air supply source through which the air is fed to the helical channel, so that the electronic components can be moved forward along the helical channel to the opening of the storage arrangement. The electronic components can then be taken out of the storage arrangement by means of the air supplied to the helical channel by the air supply source through the air supply holes.

Compared to a line-up of electronic components on so-called tapes or the like, such storage arrangements are advantageous in that they can be reused. They can be easily maintained and are mechanically robust.

However, it has appeared that maintaining the shape of the storage arrangement known from DE-OS 42 20 700 has several disadvantages. It is true, the disc-like configuration of the body of the storage arrangement according to DE-OS 42 20 700 has the advantage that, when placed on end, it requires only little space on a mounting device of the described type. In contrast to this, however, there is the disadvantage of the compulsorily diminishing channel radius from the opening of the channel to the inside of the storage arrangement, and the fact that this channel can be filled or emptied only through this single opening. In addition, different arrangements are necessary for filling and emptying, that is, on the one hand, a vibration device, and on the other, a compressed air device. The latter property alone already considerably increases the cost of maintenance of the known storage arrangement. The channel radius of the storage arrangement, which diminishes towards the inside of the disc-like body, may lead to the fact that electronic components that have certain outside dimensions, which can still without any obstruction be led to regions of the channel having a larger radius, can be moved only with difficulty or tend to jam in regions of the channel having a small radius. This may lead to problems during filling and, more particularly, during the emptying of the storage arrangement while the disc is being put in said mounting device.

SUMMARY OF THE INVENTION

It is an object of the invention to provide a storage arrangement for accommodating chip-like electronic components, by which arrangement the disadvantages of the known storage arrangement described above are eliminated.

This object is achieved according to the invention with a storage arrangement of the type defined in the opening paragraph, in that the channel for accommodating the components between a first and a second end is at least largely led along a helical line.

Whereas the radius of a helical channel along the longitudinal extension of this channel from the end of the channel compulsorily becomes ever smaller, the radius of a helical line can be adapted at will to the requirements. In this respect, a helical line is understood to be a spatial curve that can be described in the following manner in cylindrical co-ordinates comprising longitudinal co-ordinates, radius and angle of rotation:

The longitudinal co-ordinate is a monotonously increasing function of the angle of rotation, whereas the radius in the most general form of the thus defined helical line is a constant function of the angle of rotation, whose function values are always positive. Contrary to a spiral that expands in a plane, a helical line represents something three-dimensional. With such a helical line, the radius may be selected at will. A channel in the form of a helical line may then have over its entire length a radius that guarantees that the components can be aligned in predefined manner without an unwanted change and without being jammed. A channel in the form of a helical line may also be arranged to be accessible from either end and at the same time be monitored or observed over its entire length. As a result, the storage arrangement can be filled and emptied with the same direction of motion of the components in the channel. Irregularities during operation can be detected and eliminated more quickly and more easily. In addition, for example a first end of such a channel in the form of a helical line can be spatially arranged in a storage arrangement according to the invention in a simple manner with a second end of a second storage arrangement according to the invention, so that a simple transition of components is enabled between the channels of the two storage arrangements.

With such a helical line, the longitudinal co-ordinate of said cylindrical co-ordinates is also denoted a helical axis here.

For the connection of the channels of various storage arrangements according to the invention, that is to say, for the stackability, it is advantageous for the channel in the form of a helical line to have at least largely matching radiuses at its ends.

In an advantageous embodiment of the storage arrangement according to the invention, the channel is led, in essence, along a cylindrical helical line. A cylindrical helical line is understood to mean a helical line that is led at least in essence along the generated surface of a cylinder. A cylinder is then understood to be a body that is bounded by a cylinder surface with a closed directrix and two planes which, in essence, run in parallel. A cylinder surface is then understood to be the surface that is enclosed by a straight line, the so-called generatrix, when this generatrix glides along a curved, preferably closed line, the so-called directrix, without a change of its direction.

In the storage arrangement according to the invention, the described directrix of the cylinder surface along which runs the cylindrical helical line, may preferably have an elliptical or an oval shape. As a result, in a direction perpendicular to the helical axis the helical line can have a smaller diameter than in a second radial direction preferably directed perpendicular to the helical axis. In this manner a storage arrangement may be obtained with an enlarged storage capacity, without an enlargement of one of the dimensions perpendicular to the helical axis.

A very simply embodied storage arrangement according to the invention is obtained when the channel is led, in essence, along a circular cylindrical helical line. This circular cylindrical helical line stretches out along the generated surface of a circular cylinder. A channel embodied like this has the same radius at each position of a longitudinal extension and, with respect to the helical axis, also the same gradient or pitch, respectively. As a result, a thus designed storage arrangement cannot only be manufactured in a simple manner, but has at each position of the channel the same properties for the components stored therein. Consequently, highly favorable uniform conditions are created for the movements of the components in the channel, which conditions make handling of the components easier.

With a circular cylindrical helical line of this type, the directrix of the cylinder surface along which the helical line is led is formed by a circle whose center lies on the helical axis.

According to a further embodiment of the storage arrangement in accordance with the invention, the channel is connected to the exterior of the storage arrangement at least one of its ends by means of an opening. Preferably, an opening is provided at either end of the channel. A first one of these openings at the first end of the channel may preferably be used for filling the storage arrangement with components, whereas, advantageously, a second one of these openings at the second one of the ends of the channel is provided for unloading the components from the storage arrangement. The components then move inside the channel always from the first to the second opening. Thus, devices in which the storage arrangement can be filled can at least in essential features be equal to the devices that can be used for unloading the components from the storage arrangement. This implies a considerable simplification of the handling of the storage arrangement according to the invention.

At this point it is observed that from European patent application 0 108 401 is known a magazine for small electronic components, which magazine comprises a tubular body whose main part is wound to a spiral and whose end parts stretch out in axial direction of these spirals. The tubular body may be wound around a coil frame comprising a cylinder with two flange-like discs to which a respective trunnion is attached. The end parts of the tubular body are led out through openings in the flange-like discs and led to the inside of the trunnions, which at their respective ends have funnel-like openings to which bores are led ending up in the end parts. This magazine is particularly provided for storing diodes whose electrodes are formed by metal surfaces and which are arranged for direct soldering in printed circuits. These diodes comprise an isolating cylinder containing the semiconductor crystal and being closed by two metal parts whose surfaces are used as electrodes. Such a cylinder is first bonded to a printed circuit and then attached to the printed circuit board by wave soldering and fixedly connected to the circuit. Prior to the use of such components it is necessary for the cylinder to be aligned not only along its axis, but also in dependence on the polarity of the diodes. The tubular body is now constituted such that the electronic components flow through it and are guided so that they retain their alignment.

Such a magazine, which has a distinctly provisional shape and manufacture, proves to be unsuitable for storing chip-like electronic components as they are required by modem semiconductor technology. The tubular body of the known magazine only allows an alignment of the cylindrical components relative to their longitudinal axis. The alignment of chip-like components, however, also includes avoiding an indefinable rotation along such a longitudinal axis. With the known magazine, such a rotation or definition of position respectively is not a problem. Furthermore, there is a risk in the funnel openings of the trunnions that the stored components get out of the desired alignment at these places. In addition, on its end parts, but also along its main part, the tubular body has changing, undefined curvature radii which may turn out differently for the described provisional construction of the magazine from one storage arrangement to the next. This renders the carrying of components in the tubular body more unreliable than in the in essence helical channel as described in DE-OS 42 20 700. Furthermore, since the tubular body is wound on the coil frame, at least several sections of the main part of the tubular body may no longer be accessed from the exterior. If irregularities then occur in the undefined curvature radii described above when the electronic components are carried along through the tubular body, possibly these irregularities, for example, jammings can only be remedied at great expense, possibly only by destroying the tubular body.

In addition, on account of its provisional construction, the manufacture of the magazine known from EP 0 108 401 A2 is not only more expensive than the manufacture of the storage arrangement according to the invention, which can be effected in a very simple and cost-effective manner with manufacturing means for industrial scale manufacture, but the known magazine also has a bulky shape which is unfavorable when handled on modern semiconductor arrangements.

In a preferred further embodiment of the storage arrangement according to the invention, this storage arrangement has a first base-like projecting portion in the region of the first end of the channel and a second base-like projecting portion in the region of the second end of the channel, which base-like projecting portions are each other's complement, and the second base-like projecting portion of a first storage arrangement can be joined to the first base-like projecting portion of a second storage arrangement for connecting the second opening at the second end of the channel of the first storage arrangement to the first opening at the first end of the channel of the second storage arrangement for the components to pass through.

Via these base-like projecting portions, each time two storage arrangements according to the invention can be coupled to each other in a very simple manner. As a result, the storage capacity can be increased or the components may be put from one storage arrangement into another storage arrangement.

In a further embodiment of the storage arrangement according to the invention, the channel is led over its entire length along a circular cylindrical helical line. The pitch of this circular cylindrical helical line has an in essence first value between the regions around the ends of the channel. In the regions of the ends of the channel, the pitch has a second value, which is higher than the first value of the pitch. In the regions of the ends, the mutual distance of the turns of the channel is increased by the increased pitch. This enables a robust construction of the storage arrangement according to the invention, which is insensitive to mechanical damage when the base-like projecting portions are combined. Between the regions around the ends of the channel, however, its turns should be as close together as possible, in accordance with an extremely small first value of the pitch to keep the storage capacity of the storage arrangement as large as possible for predefined overall measurements. Nonetheless, the shape of the channel which is essential to the invention will be kept in accordance with a helical line also in the regions of the ends of the channel. This guarantees here too a precise handling of the chip-like components. This is a great advantage for the coupling of the storage arrangement according to the invention, for example, to a second storage arrangement.

In another embodiment of the storage arrangement according to the invention, in which the channel is led over its entire length along a cylindrical helical line, this storage arrangement has a construction with a cylindrical inner body and a cylindrical outer body. The inner body has an outside generated surface with which it is inserted into the outer body along an inside generated surface of the outer body. The generated surfaces of the inner body and of the outer body at least largely have mutually adapted contours.

An assembly of this type can easily be manufactured. It also enables to manufacture the channel in a very simple manner when the latter, in an advantageous further embodiment, is embedded in the inner body at least largely along the outside generated surface of the inner body. More particularly the lands of the channel may be embedded in the inner body in three directions perpendicular to the longitudinal extension of the channel, whereas the inside generated surface of the cylindrical outer body forms an edge of the channel in the fourth direction perpendicular to the longitudinal extension of the channel. It is very simple to manufacture such a construction in large volumes by injection molding in an accurate, cost-effective manner. Also other manufacturing methods or other materials can be used without further measures being taken.

In a further embodiment of the storage arrangement according to the invention, the first and second base-like projecting portions are at least to a considerable extent adapted to the inner body. In this manner the base-like projecting portions and the channel always have a defined position relative to each other, irrespective of tolerances or irregularities during manufacturing or handling of the storage arrangement.

According to a further embodiment, the outer body of the storage arrangement according to the invention is formed at least in sections of an at least largely transparent material. This enables a fast, simple survey of the channel, so that filling level or irregularities during operation can be recognized fast and reliably with the storage arrangement according to the invention. An embodiment described above with an inner body and an outer body furthermore enables a fast access to any position of the channel.

Advantageously, the openings at the ends of the channel of the storage arrangement according to the invention have each a locking element for locking the channel to avoid components included therein coming out. Preferably, these locking elements may be spring-mounted, which enables forming these elements in a simple way. Advantageously, each base-like projecting portion has its own actuating element by which the locking element in the area of the complementarily arranged base-like projecting portion of a further storage arrangement can be actuated when these two storage arrangements are connected by the opening of the channel. Co-operation between such an actuating element of a first storage arrangement and a locking element of a second storage arrangement then occurs when the two storage arrangements are joined by their complementary base-like projecting portions. The combination then automatically actuates the locking element, so that the channel is opened. More particularly the actuating elements of the two storage arrangements simultaneously influence, the locking elements of the respective other storage arrangement within the range of the joined base-like projecting portions. When the two storage arrangements are coupled, the two locking elements are opened simultaneously; when the two storage arrangements are separated, the two locking elements automatically again simultaneously close the openings of the channels. Without additional operating steps, a loss of components is bound to happen.

Preferably, the base-like projecting portions of the storage arrangement are arranged, in essence, as a bayonet catch. This enables a fast and uncomplicated joining and separation of storage elements.

The storage arrangement according to the invention can in a simple-structured and reliable device be filled with components and the components can also be unloaded therein from the storage arrangement. Such a device advantageously includes a first sub-assembly preferably for filling the storage arrangement with components. The first base-like projecting portion of the storage arrangement can be coupled to this first sub-assembly. The first sub-assembly has a feeding element arranged in the form of a channel, which can be aligned to the first opening of the channel of the storage arrangement. Via the feeding element the components can then be inserted into the channel through the first opening and the storage arrangement can be filled in this manner. Preferably, for this filling operation the feeding element has an essentially linear vibrating movement. The feeding element is therefore advantageously coupled to a first vibration device arranged for such a movement. More specifically, such a vibration movement working together with gravitation is exerted on the components to be moved. For this purpose, the feeding element may have an inclination in the direction to the first opening of the storage arrangement. Advantageously, also the storage arrangement is brought to a position in which the channel has a similar inclination. This is preferably attained by installing the storage arrangement with an essentially perpendicular helical axis. In addition, the storage arrangement may be actuated by an essentially radial vibration movement, which will be reverted to hereinafter.

A device for handling the storage arrangement according to the invention may, preferably for unloading the components, be arranged such that the second base-like projecting portion of the storage arrangement can be coupled to a second sub-assembly. This second sub-assembly of a device arranged in this way has a channel-like discharge element which, for unloading the components from the storage arrangement, can be aligned to the second opening of the channel of the storage arrangement.

Since the discharge element, on the one hand, and the feeding element, on the other, are coupled to two different openings of the storage arrangement, components in the device can be put into the storage arrangement and also unloaded therefrom. This allows a highly flexible, variable handling of the storage arrangement according to the invention.

Preferably, a device of said type has a base-like projecting portion whose embodiment for accommodating the second base-like projecting portion of the storage arrangement at least largely corresponds to the shape of the first base-like projecting portion of this storage arrangement. This base-like projecting portion of the device provides an alignment of the second opening of the channel of the storage arrangement to the discharge element. The base-like projecting portion of the device thus, on the one hand, provides the mechanical support of the storage arrangement when handled for unloading the components and at the same time guarantees their flawless transition from the channel through the second opening into the discharge element. A uniform design of the base-like projecting portions may provide that any storage arrangement can be coupled to the device and also joined to each other. As a result, a plurality of storage arrangements can be cascaded to the device at the same time in such a way that their channels can be passed through in succession and with the discharge element can be passed through continuously.

With a device of the type described above, the base-like projecting portion of this device and the discharge element can be jointly coupled to a second vibration device. This second vibration device is advantageously arranged, in essence, for a radial vibration movement. In this design the device has a very simple, compact construction.

Also for transporting the components within the discharge element, a co-operation between the vibration movement and the influence of gravity may be used to advantage.

In a variation of the device, separate vibration devices can be provided for the discharge element, on the one hand, and the base-like projecting portion of the device, on the other. A radial vibration movement is then preferred for the base-like projecting portion, preference being given to a radial vibration movement which is imposed on this base-like projecting portion by means of an accordingly designed vibration device. A further vibration device which is, in essence, designed for a linear vibration movement, is then separately connected to the discharge element. This slightly more expensive construction, however, alternatively makes it possible to design the discharge element with a larger length and smaller slope i.e. a smaller influence of gravity.

For a storage arrangement in which the openings of the channel have each a locking element for closing the channel to avoid components included therein escaping, the base-like projecting portion of the device may have an actuating element by which the locking element in the region of the second opening of the channel of the storage arrangement can be actuated in that the channel is opened, when the second base-like projecting portion of a storage arrangement designed in said manner is joined to the base-like projecting portion of the device. When the storage arrangement is coupled to the device, the opening of the channel for allowing the components to pass in the direction of the discharge element is released automatically in the same manner as when two such storage arrangements are coupled.

An advantageous further embodiment of the described device includes a stop device for interrupting the feeding of components from the channel of a coupled storage arrangement. Such a stop device, which works independently of the actuation of the locking elements of the storage arrangement, is advantageously used for interrupting the feeding of components in the storage arrangement still coupled to the device. For example, this stop device can interrupt the feeding of components to prepare the separation of the storage arrangement from the device. This provides the possibility of removing components from the region of the channel opening, preferably from the region of the second opening, for example, in that the discharge element is further operated over a predefinable period of time depending on the destination as agreed, prior to the storage arrangement being removed from the device. This avoids an uncontrollable loss of components and a disturbance as a result of components leaving the channel opening in uncontrolled manner.

A particularly simple and manageable as well as robust embodiment of the base-like projecting portions of the device and of the storage arrangement is achieved in that the base-like projecting portion of the device is arranged in similar fashion to the base-like projecting portions of the storage arrangement by way of a bayonet catch. A bayonet catch design of the base-like projecting portions is especially suitable in that, conventionally, there are regions on these base-like projecting portions which determine a brief screw-like installing movement. These regions, however, can be advantageously arranged at little expenditure so that, in addition to a flexible coupling, they also guarantee a very precise alignment of the storage arrangement in the device and thus a very precise alignment of the channel openings of this storage arrangement. A precise positioning of the storage arrangement in operation in spite of very simple handling is thus guaranteed in a simple manner.

BRIEF DESCRIPTION OF THE DRAWINGS

An example of embodiment of the invention is shown in the drawing and will be further described in the following, in which:

FIGS. 26 to 37 show the handling of the above-represented example of embodiment of the storage arrangement according to the invention with the device for unloading the components when the unloading is interrupted and the storage arrangement is separated from the device, while FIGS. 26 to 37 represent a sectional view along the section S—S as shown in FIG. 22, turned through 90° clockwise. More specifically.

FIG. 26 shows a first working condition comparable to a first moment in time of said handling with reference to said sectional view, FIG. 27 shows the detail T of FIG. 26, FIG. 28 shows a second working condition in a representation comparable to FIG. 26, FIG. 29 shows the detail of FIG. 28, FIG. 30 shows a third working condition in a representation corresponding to FIG. 26, FIG. 31 shows the detail V of FIG. 30

FIG. 32 shows a fourth working condition in a representation corresponding to FIG. 26, FIG. 33 shows the detail W of FIG. 32, FIG. 34 shows a fifth working condition in a representation corresponding to FIG. 26, FIG. 35 shows the detail X of FIG. 34, FIG. 36 shows a sixth working condition in a representation corresponding to FIG. 26, and FIG. 37 shows the detail Y of FIG. 36.

Like elements of the example of embodiment have like references in a representation in different Figures.

DESCRIPTION OF THE PREFERRED EMBODIMENTS

Figure 6:
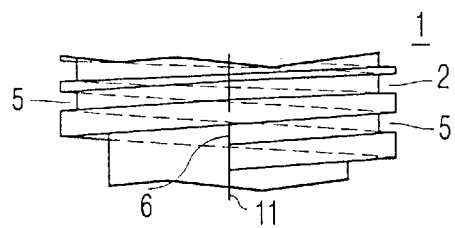
Figure 7:
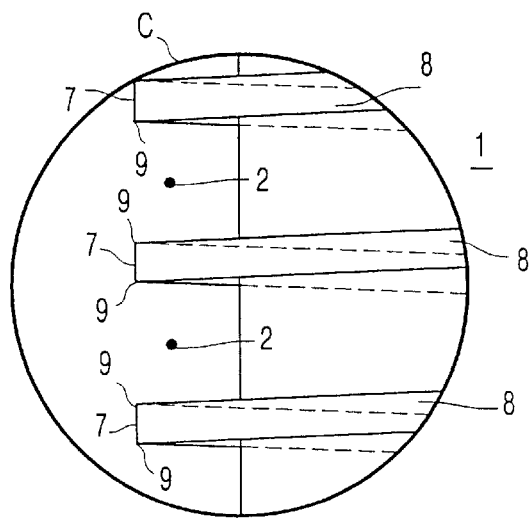
Figure 8:
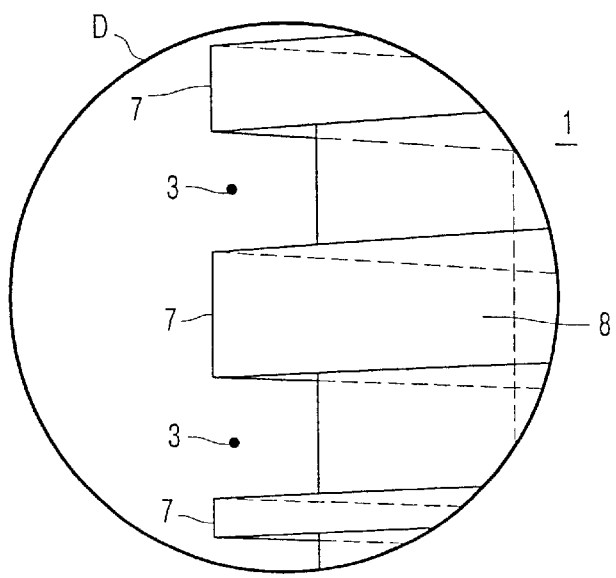

The example of embodiment of the storage arrangement according to the invention shown in the Figures has a channel 2 leading along a circular cylindrical helical line. This channel is led along an outside generated surface of a circular cylindrical inner body 1 as is shown in FIGS. 1 to 11. The channel 2 has a rectangular cross-section perpendicular to the described circular cylindrical helical line. The cross-sectional dimensions of the channel 2 are adapted to a predefined chip-like electronic component, so that this component can run through the channel 2 in a predefined alignment, without its alignment to the circular cylindrical helical line being unintentionally changed or without the component jamming in channel 2. In the example of embodiment shown, the channel 2 extends over a total of 72 turns or threads of the circular cylindrical helical line. The front thread of the channel 2 in the plan view (view B) of the inner body 1 forms its first end 3, in which the channel 2 can be filled with components via a first opening 4. This region of the channel 2 can therefore also be referenced loading region. The first opening 4 at the first end 3 of the channel 2 is represented in enlarged form as detail F, for example, in FIG. 10. FIG. 8 gives an enlarged representation of the channel 2 at the first end 3 with the enlarged pitch is given by as detail D.

Figure 11:
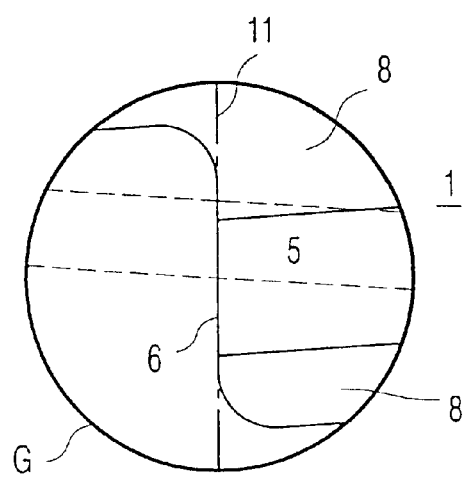

The front thread of the channel 2 in the bottom view (view A) forms its second end 5, has an enlarged pitch compared to the further turns of the channel 2, which pitch corresponds to the pitch at the first end 3 of the channel 2, and leads into a second opening 6. The second opening 6 is preferably used for unloading the components from the storage arrangement. The second end 5 of the channel 2 of the storage arrangement therefore preferably forms an unloading region. FIG. 11 shows this second end 5 as an enlarged detail G of FIG. 1.

Figure 1:
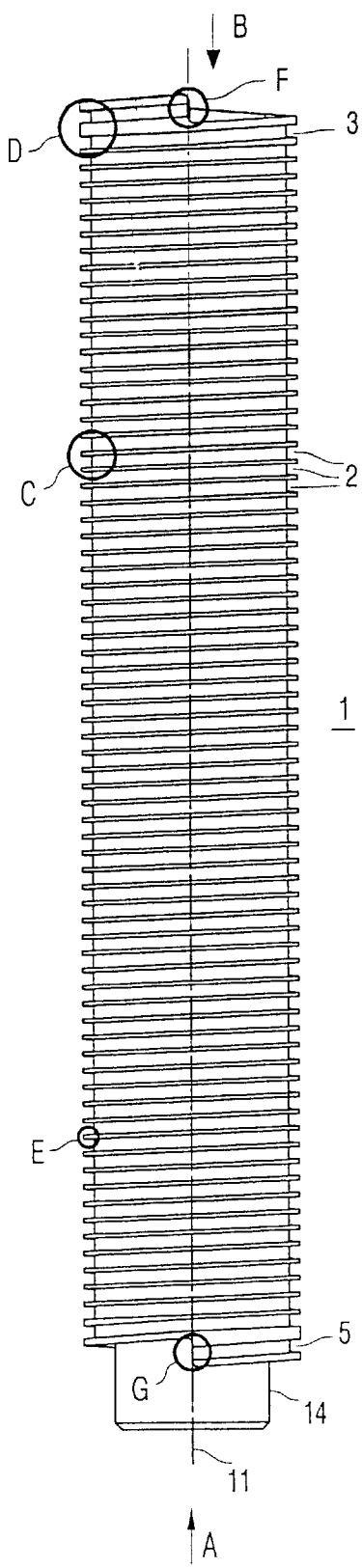
FIG. 1 shows an inner body of an example of embodiment of the storage arrangement according to the invention.
Figure 9:
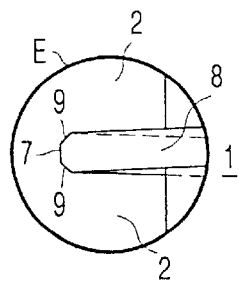

In the region of the channel 2, which channel stretches out between the first end 3 and the second end 5, and in which at least in essence the components are stored, the channel 2 has a smaller pitch than at the ends 3, 5. This is represented in FIG. 7 as an enlarged version of detail C of FIG. 1. In addition, detail E of FIG. 1 shown in FIG. 9 is an enlarged representation of a variation of the projecting portion of the inner body 1 in the region of the projecting portions of the material of the inner body 1 which form the lands of the channel 2. This material forms a land 8 between every two threads of the channel 2, which land follows, at least in essence, the circular cylindrical helical line along which the channel 2 stretches out. The edges 9 of this land 8, which contact the circular cylindrical outside generated surface 7 of the inner body 1, are beveled or at least deburred in the variant shown in FIG. 9. This avoids, on the one hand, burrs on these edges 9 affecting the movement of the components in channel 2.

Figure 5:
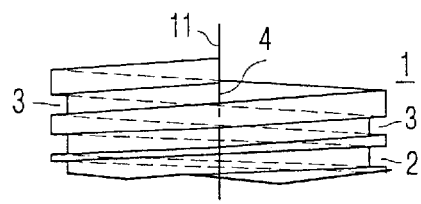

At the transition between the first end 3 of the channel 2 to its storage area and also between this storage area and the second end 5 of the channel 2, also the gradient of the circular cylindrical helical line along which the channel 2 is led changes together with the different pitches. FIG. 5 shows this transition in the region of the first end 3 of the channel 2, whereas, on the other hand, FIG. 6 shows the transition to the second end 5. In the example of embodiment shown, the change of the gradient takes place exactly with the transition to the last turn. As a result of the enlarged pitch, the width of the land in the direction of the helical line is increased in the region of the ends 3, 5 of the channel 2. This enables to realize the inner body 1 in the region of the ends in a mechanically more stable manner than would be the case with unchanged pitch and thus width of the land in the region of the ends 3, 5.

Figure 2:
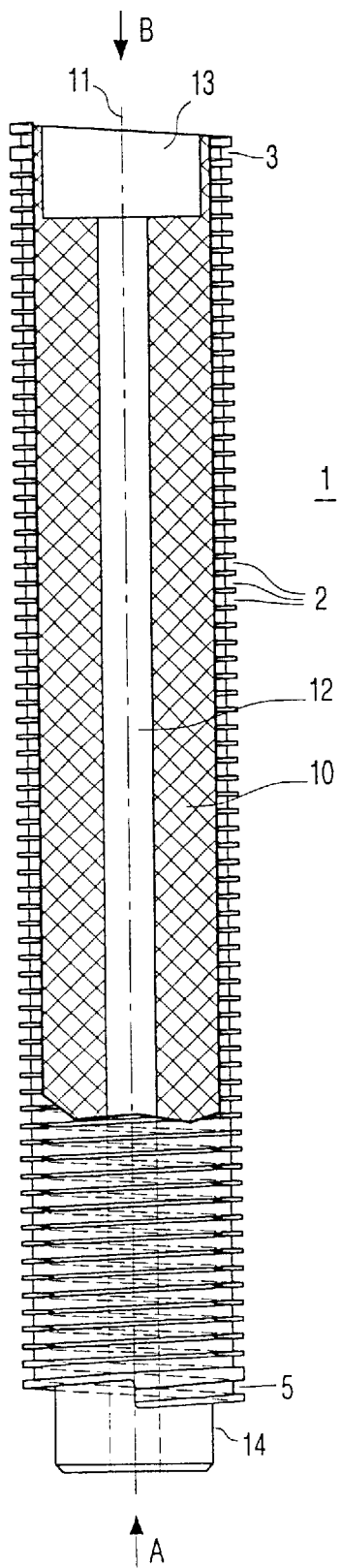
FIG. 2 shows the inner body as shown in FIG. 1, represented in a broken-away view.
Figure 3:
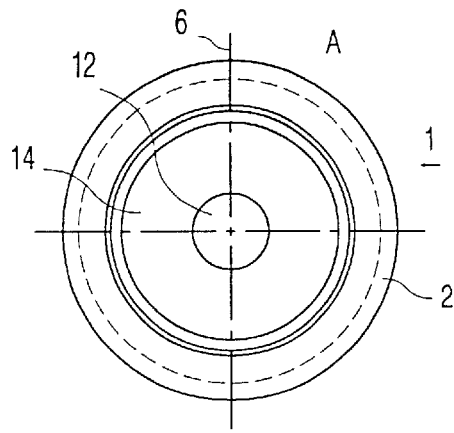
FIG. 3 shows a bottom view (view A) of the inner body shown in FIG. 1.
Figure 4:
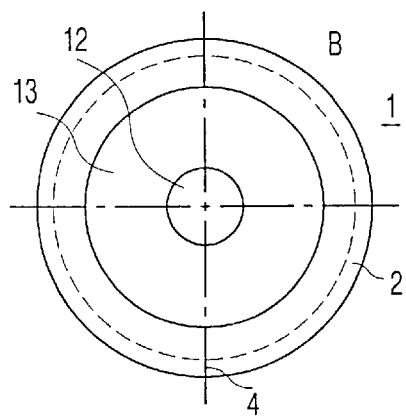
FIG. 4 shows a plan view (view B) of the inner body shown in FIG. 1, FIG. 5 gives a representation of the various pitches of the channel in the inner body shown in FIG. 1 in the region of the first end of the channel, FIG. 6 gives a representation of the various pitches of the channel in the inner body shown in FIG. 1 in the region of the second end of the channel, FIG. 7 gives an enlarged representation of the detail C in the inner body shown in FIG. 1, FIG. 8 gives an enlarged representation of the detail D of the inner body shown in FIG. 1, FIG. 9 gives an enlarged representation of the detail E of the inner body shown in FIG. 1, FIG. 10 gives an enlarged representation of the detail F of the inner body shown in FIG. 1, FIG. 11 gives an enlarged representation of the detail G of the inner body shown in FIG. 1.

FIG. 2 represents the circular cylindrical inner body 1 of the storage arrangement partly in a broken away view 10 which, in essence, corresponds to a partial longitudinal section along the helical line through the inner body 1. This representation visualizes a circular cylindrical recess (or bore respectively) 12 concentric to the helical line 11 in the material of the inner body 1. This recess 12 extends over the whole length of the inner body 1 along the helical axis 11. In the region of the first end 3 of the channel 2, the recess 12 shows a pot-like widening which forms a first base-like projecting portion 13. In the region of the second end 5 of the inner body 1, on the other hand, there is a second base-like projecting portion 14 which is also arranged concentrically with respect to the helical line 11 and is complementary to the first base-like projecting portion 13. FIG. 4 shows in view B a front view of the first base-like projecting portion 13, whereas in FIG. 3, in view A a front view is shown of the second base-like projecting portion 14.

As a result of the complementary kind of the base-like projecting portions 13, 14, a plurality of storage arrangements according to the invention can be connected to each other along the helical line 11 so that components can uninterruptedly pass through their channels 2 through all the thus coupled storage arrangements. For this purpose, the first opening 4 of the channel 2 of one of these storage arrangements forms a through connection to the second opening 6 of the channel 2 of a respective adjacent coupled storage arrangement. A respective connection is set up between the second opening 6 of the channel 2 of the first-mentioned storage arrangement and the first opening 4 of the channel 2 of a further storage arrangement.

Figure 10:
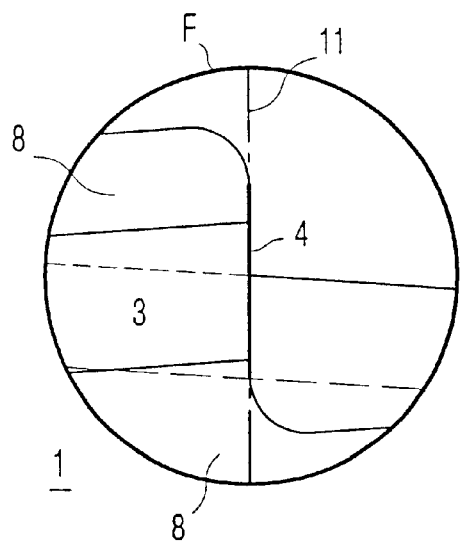

FIGS. 10 and 11 show on an enlarged scale as details F and G respectively, the shape of the inner body 1 in the neighborhood of the openings 4 and 6 respectively of the channel 2. The material of the lands 8 is rounded off in the neighborhood of the openings 4 and 6, so that the storage arrangements according to the invention can be joined together better via the base-like projecting portions 13 and 14 respectively, while at the same time a reduction of the mechanical sensitivity to damage is achieved. Furthermore, in the example of embodiment shown, the pitch of the helical line in the region of the ends 3, 5 is selected to be such that the width of the land 8 measured in the direction of the helical line becomes twice as large from the value in the storage area of the channel 2 at the transition between this storage area and the respective end 3, 5 up to the associated opening 4, 6 respectively of the channel 2. The last land in the direction of the helical line 11, which is the last edge of the channel 2 in the region of the ends 3, 5 respectively, may then have the same width relative to the helical line 11 as the land 8 within the storage area of the channel 2. Without an enlarged pitch at the ends 3 and 5, this width of the land should be reduced compared to that of the storage area of the channel 2.

Figure 12:
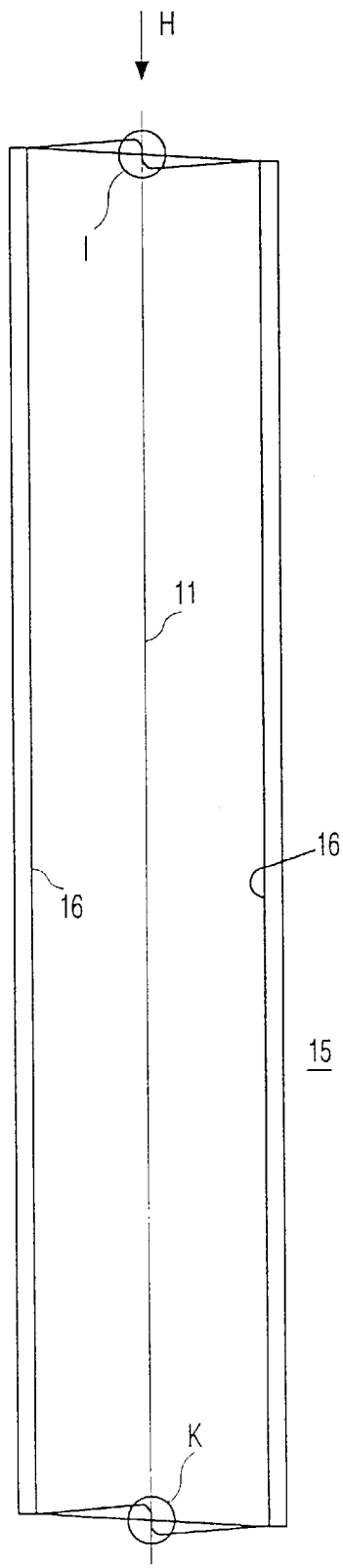
FIG. 12 shows an example of embodiment for an outer body of the example of embodiment of the storage arrangement shown in the previous Figures.
Figure 13:
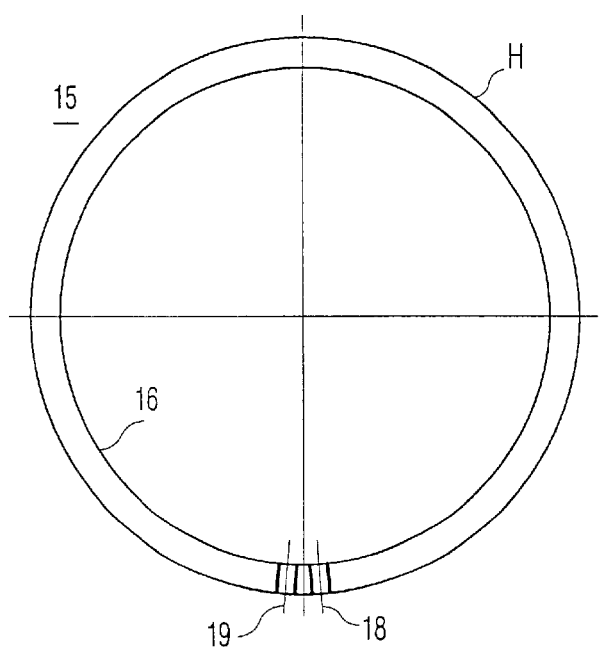
FIG. 13 shows a plan view (view H) of the outer body shown in FIG. 12 in enlarged representation.

The beveled edges 9 of the land 8 shown in FIG. 9 on the other hand make the mounting easier of the inner body 1 with an outer body 15, as shown for example in FIGS. 12 to 15, to the storage arrangement according to the invention. The outer body 15 according to this example of embodiment is arranged as a hollow cylinder which is concentric relative to the helical line 11, the inside generated surface 16 of which outer body having at least largely the same dimensions as the outside generated surface 7 of the inner body 1, so that for mounting the inner body 1 onto the outer body 15, the two bodies can be slipped into each other along the helical line 11. The bevels of the edges 9 of the land 8 then avoid these lands 8 being caught by the edges of the outer body 15 i.e. the front end borders of the inside generated surface 16. These borders of the inside generated surface 16 are further adapted to the contour of the inner body 1, thus have the same gradient and preferably also the roundings in the region of the openings 4 and 6 respectively. These roundings are shown in the enlarged representation of the details I and K of the outer body 15 in the FIGS. 14 and 15 respectively. FIG. 13 furthermore shows a view H of the outer body 15 in enlarged representation. After mounting the inner body 1 onto the outer body 15, the view H i.e. the front view of the outer body 15 corresponds to the direction of vision B of the inner body 1 in accordance with FIG. 4.

To be able to monitor the state of filling and the working condition of the storage arrangement in a simpler way, the outer body 15 is preferably made of a transparent material.

Figure 14:
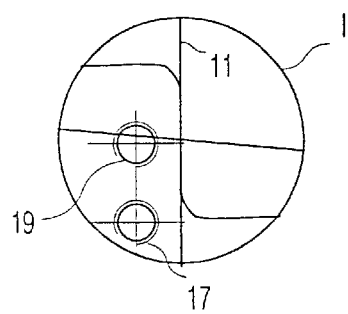
FIG. 14 shows the detail I of the outer body shown in FIG. 12 in enlarged representation.
Figure 15:
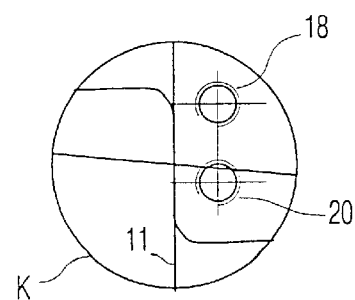
FIG. 15 shows the detail K of the outer body shown in FIG. 12 in enlarged representation.
Figure 16:
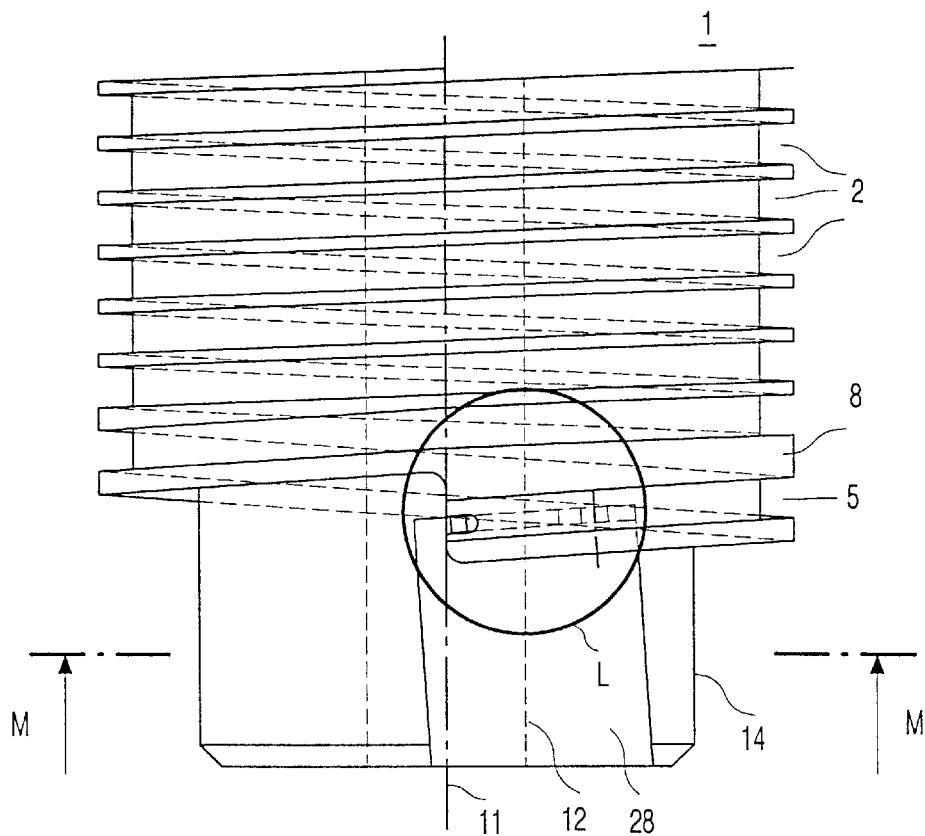
FIG. 16 shows a section of the inner part shown in FIG. 1 in the region of the second end of the channel with an example of embodiment of the arrangement of a locking element.

In the representation shown in FIGS. 13 to 15 there are two tap holes 17, 19 and 18, 20 respectively in the region of the details I and K. When inserting a screw into the tap hole 17, which is positioned in the region of the first end of the channel 2 when the inner body 1 is mounted onto the outer body 15, and a screw in the tap hole 18 which is accordingly positioned in the region of the second end 5, the inner body 5 and the outer body are locked on to each other. As opposed to this, the tap hole 19 in the region of the first end 3 and 20 in the region of the second end 5 are positioned such that screws inserted into these holes can penetrate into the said ends 3 and 5 respectively of the channel 2. As a result, these screws have the function of a locking element for closing the channel to prevent components included therein from escaping.

In the representations of FIGS. 1 and 12, after the mounting of the inner body 1 onto the outer body 15, the details F and I, on the one hand, and the details G and K, on the other, are positioned identically.

Figure 17:
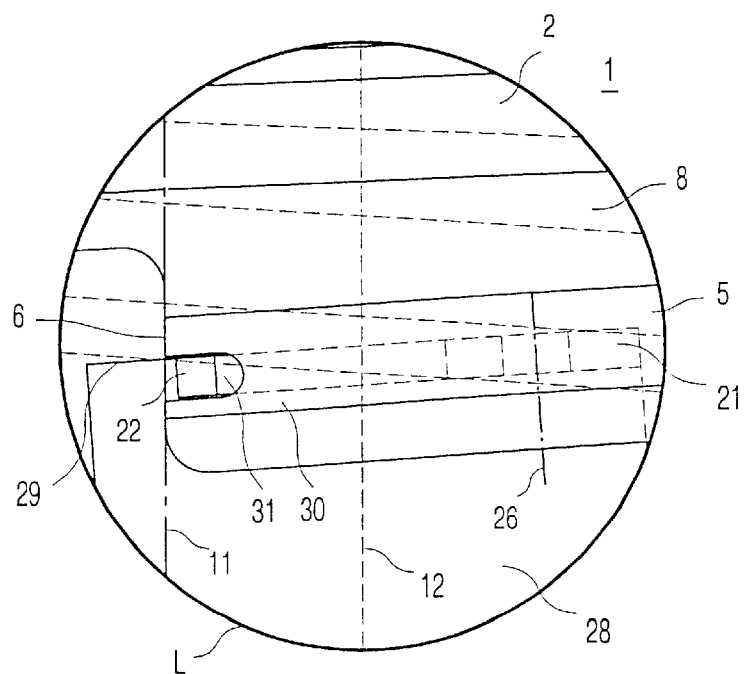
FIG. 17 shows the detail L of FIG. 16 in enlarged representation.
Figure 18:
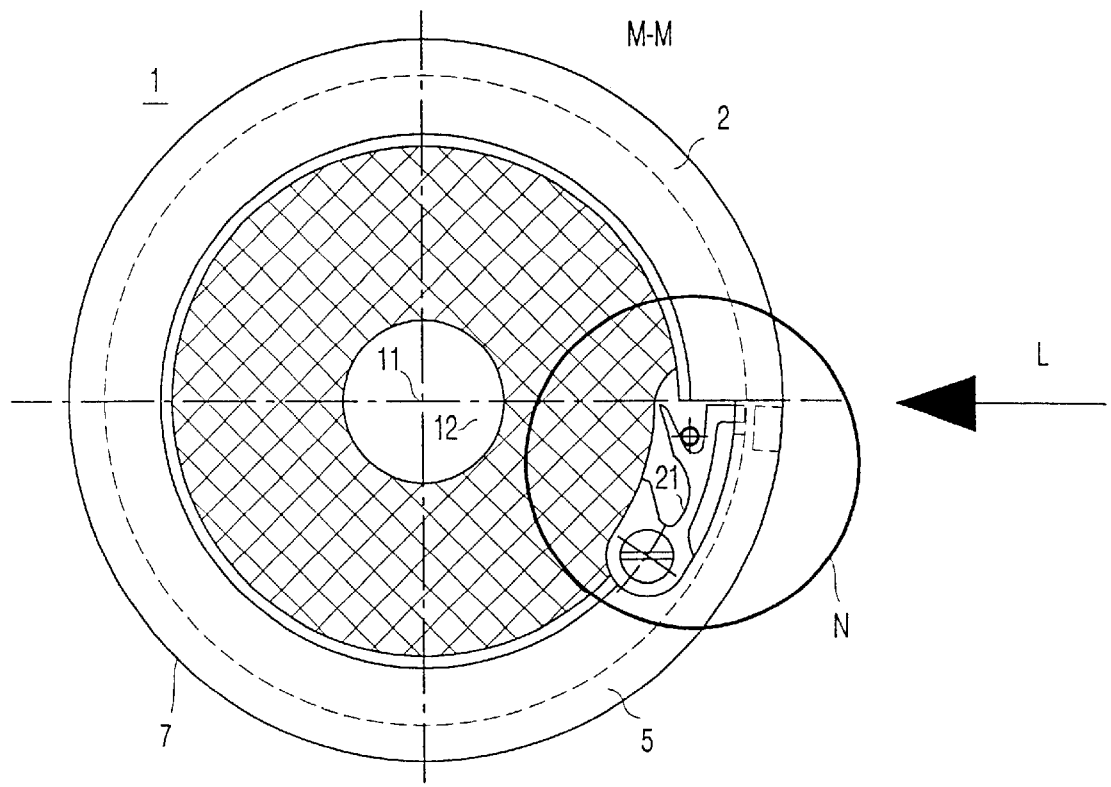
FIG. 18 shows a sectional view of the example of embodiment of the inner body shown in FIG. 16 along the line M—M, turned through 90° clockwise.
Figure 19:
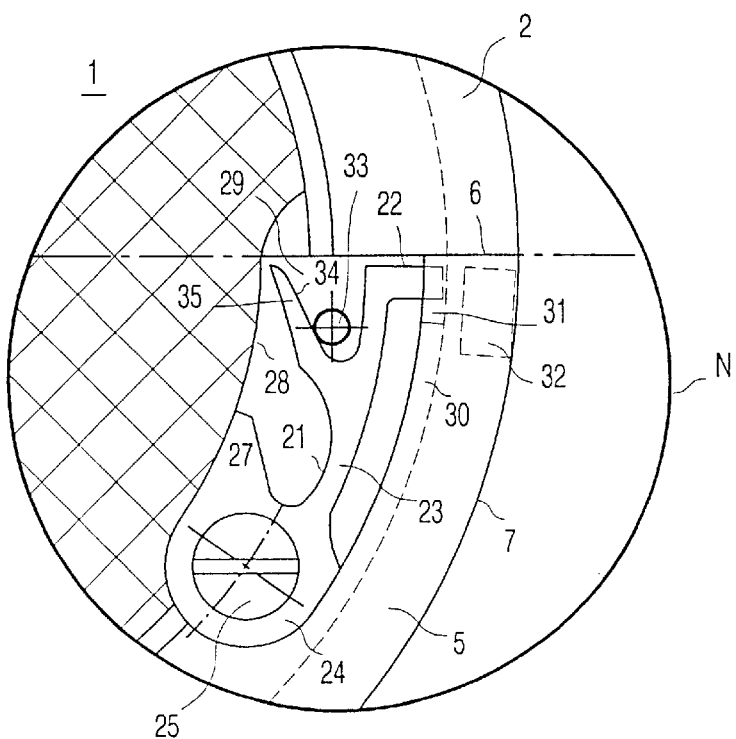
FIG. 19 shows the detail N of FIG. 18 in enlarged representation.
Figure 20:
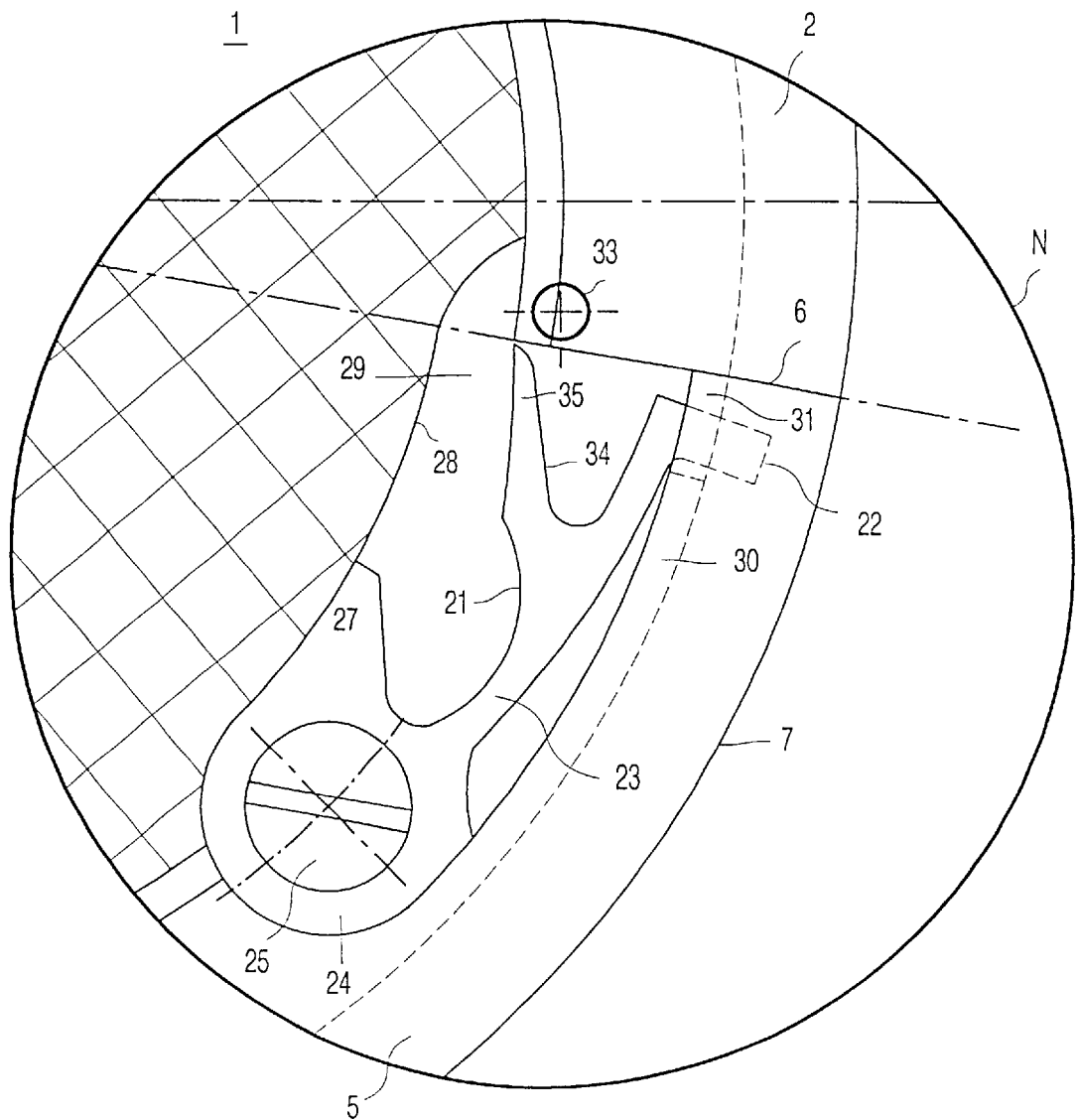
FIG. 20 shows the detail N of FIG. 18 in an operating condition that is different from the representation given in FIG. 19, FIG. 21 gives a representation of the stackability of two storage arrangements according to the invention by means of the representation of the inner bodies of these storage arrangements in an embodiment according to FIG. 16.

A simply operable embodiment of such a locking element is represented in FIGS. 16 to 20. The directions of vision in the representations shown in FIGS. 16 and 17 correspond to the direction of vision of the representation of FIG. 1, whereas FIG. 18 represents a cross-section of the representation of the inner body 1 of FIG. 16 along the line M—M turned through 90° clockwise. FIG. 17 shows in enlarged form the detail L of FIG. 16. The FIGS. 19 and 20 show the detail N of FIG. 18 in different states of operation. For additional orientation's sake, FIG. 18 shows with an arrow the direction of vision of the detail L of FIG. 17.

The locking element 21 shown in FIGS. 16 to 20 as an example of the second end 5 of the channel 2 is arranged as a retaining pawl. The body of this retaining pawl-like locking element 21 stretches out, in essence, parallel with the part of the helical line along which the second end 5 of the channel 2 is led. One end of the locking element 21—relative to the recess parallel with the helical line— immediately bounds the second opening 6 at the second end 5 of the channel 2. At this point the body of the locking element 21 has a L-shaped bent member 22 which stretches out, in essence, radially i.e. perpendicularly to the helical axis 11 away from this helical axis 11 into the second end 5 of the channel 2 immediately neighboring the second opening 6. This L-shaped bent member 22 can allow the locking element 21 to swing into the second end 5 of the channel 2. As a result, the components from the second end 5 of the channel 2 are prevented from passing through the second opening 6. If, on the other hand, the end of the locking element 21 with the L-shaped bent member 22 is swung in the direction of the helical axis 11, the L-shaped bent member 22 releases the second end 5 of the channel 2 for components to pass through. In the FIGS. 18 and 19 is then shown the working condition with components freelypassing through and in FIG. 20 is shown the working condition in which the escape is interrupted.

To enable the described swinging movement at the end of the L-shaped bent member 22, the body of the locking element 21 in its midsection may have a taper 23, as is shown in FIGS. 18 to 20. This taper 23 is springy as a result of which said swinging movement of the L-shaped bent member 22 is made possible. The end of the body of the locking element 21 lying opposite the L-shaped bent member 22 may then be fixedly connected to the inner body 1 of the storage arrangement. In the example of embodiment according to FIGS. 16 to 20, the end 24 of the body of the locking element 21 lying opposite the L-shaped bent member 22 is connected to the inner body 1 by means of a screw 25. The axis of this screw is referenced 26 in FIG. 17 and is perpendicular to the helical line. To support the end 24 of the body of the locking element 21, which end lies opposite the L-shaped bent member 22 and is fixed to the inner body 1 by the screw 25, against unintentional rotation about the axis 26 of the screw 25, a support lug 27 is formed at this end 24. This support lug 27 rests against a land of the inner body 1 which forms part of a generated surface 28 of a recess, which is recessed in the inner body 1 in the region of the second base-like projecting portion 14. As a directrix of this recess is provided an oval whose larger dimension stretches out in essence along the helical line and which has a curved shape adapted to the curve of the helical line. The surface stretched by this directrix is perpendicular to the axis 26 of the screw 25. It is particularly pointed out that the axis 26 of the screw 25 is not identical with the helical line 11 of the directrix along which the channel 2 extends.

The locking element 21 is fixed with the aid of the screw 25 to a bottom surface 29 of the described recess.

As against the second end 5 of the channel 2, the described recess is separated by a wall portion 30 so that no component can get from the end 5 into the recess. For reaching the L-shaped bent member 22 of the locking element 21 from the recess in the second end 5 of the channel 2, a recess 31 is formed in the wall portion 30. For clarification, FIG. 19 also shows with reference character 32 a chip-like component which is located in the second end 5 of the channel 2, immediately before the second opening 6 opposite the L-shaped bent member 22 of the locking element 21.

For actuating the locking element 21 is used an actuating element 33 which is referenced in FIGS. 19 and 20 and may have a pin-like form. This actuating element 33 is not connected to the inner body 1, but can, as will be further explained in the following, be moved relative to the inner body 1 and thus to the locking element 21. With this movement which may furthermore also be performed by kinematic reversal with its moving inner body 1 and fixed actuating element 33, the actuating element 33 moves, in essence, in the direction of the helical line along which the channel 2 is led, across from the inner body 1. The actuation element 33 then glides along a stop plane 34 of an actuation extension 35. The actuation extension 35 is extended to the body of the locking element 21 in an, in essence, rigid connection to the L-shaped bent member 22. If, for the purpose of the said movement between the actuation element 33 and the inner body 1, the actuation element 33 and the locking element 21 are moved in each other's direction, the actuation extension 35 glides along its stop face 34 past the actuation element 33 and is therefore turned into the direction of the helical axis 11. As a result of the essentially rigid connection between the actuation extension and the L-shaped bent member 22, this movement is co-performed by the L-shaped bent member 22. As a result, the L-shaped bent member 22 is turned away from the second end 5 of the channel 2 and the path for the components located in the channel and leading through the second opening 6 out of the storage arrangement is cleared. By reversing the movement between the actuation element 33 and the inner body 1, the L-shaped bent member 22 again swings out and locks the second end 5 of the channel 2. The FIGS. 19 and 20 show two end positions of the movement between the actuation element 33 and the inner body 1.

In a variation of embodiment the body of the locking element 21 may be, in essence, rigid and be swung and kept in the end positions of this swinging movement by means of a spring element that can be applied additionally, or arrangements working in similar fashion. It is alternatively possible to put the locking element 21 directly on the inner body 1. This variation is particularly advantageous for manufacturing the inner body 1 by means of plastic injection molding technique. The locking element 21 could also be fastened to the inner body 1 by plugging it in, so that the screw 25 could be omitted. Basically, the use of the plastic injection molding technique is recommended for the manufacture of both the inner body 1 and the outer body 15, because in this manner the storage arrangement according to the invention can be manufactured in large numbers in an extremely cost-effective way. Obviously, the individual portions of the storage arrangement according to the invention may also be manufactured from other materials, for example, metals and by means of other manufacturing techniques, such as turning and/or milling.

As in the region of the second base-like projecting portion 14 of the inner body 1, also in the region of the first base-like projecting portion 13 there may accordingly be arranged a further locking element for which the above embodiments can be used in comparable fashion. The channel 2 can then be shut off on both ends 3, 5.

Figure 21:
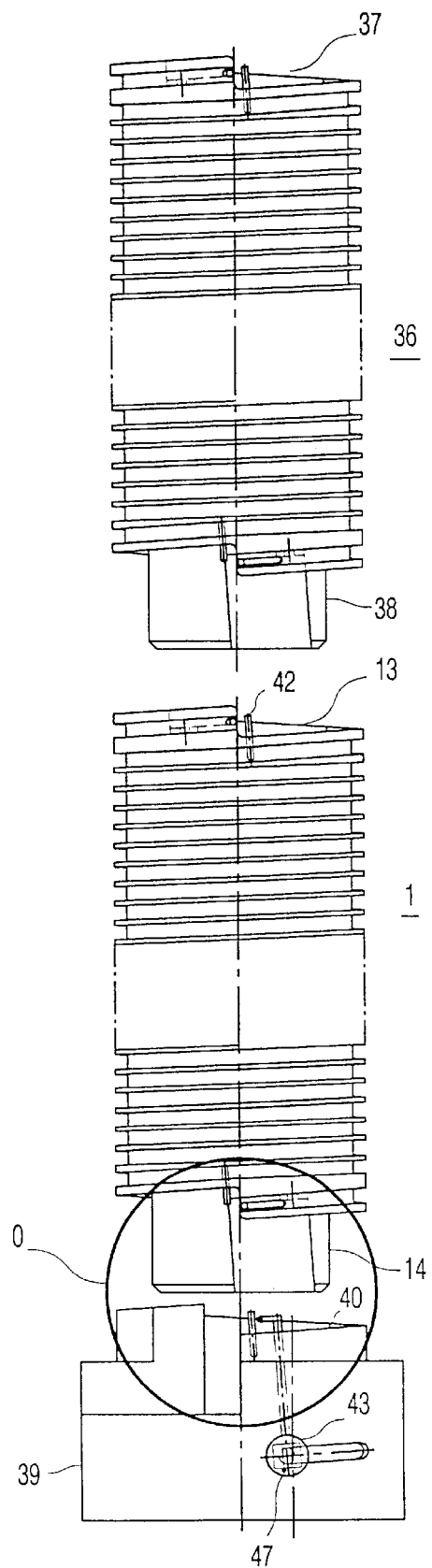
Figure 22:
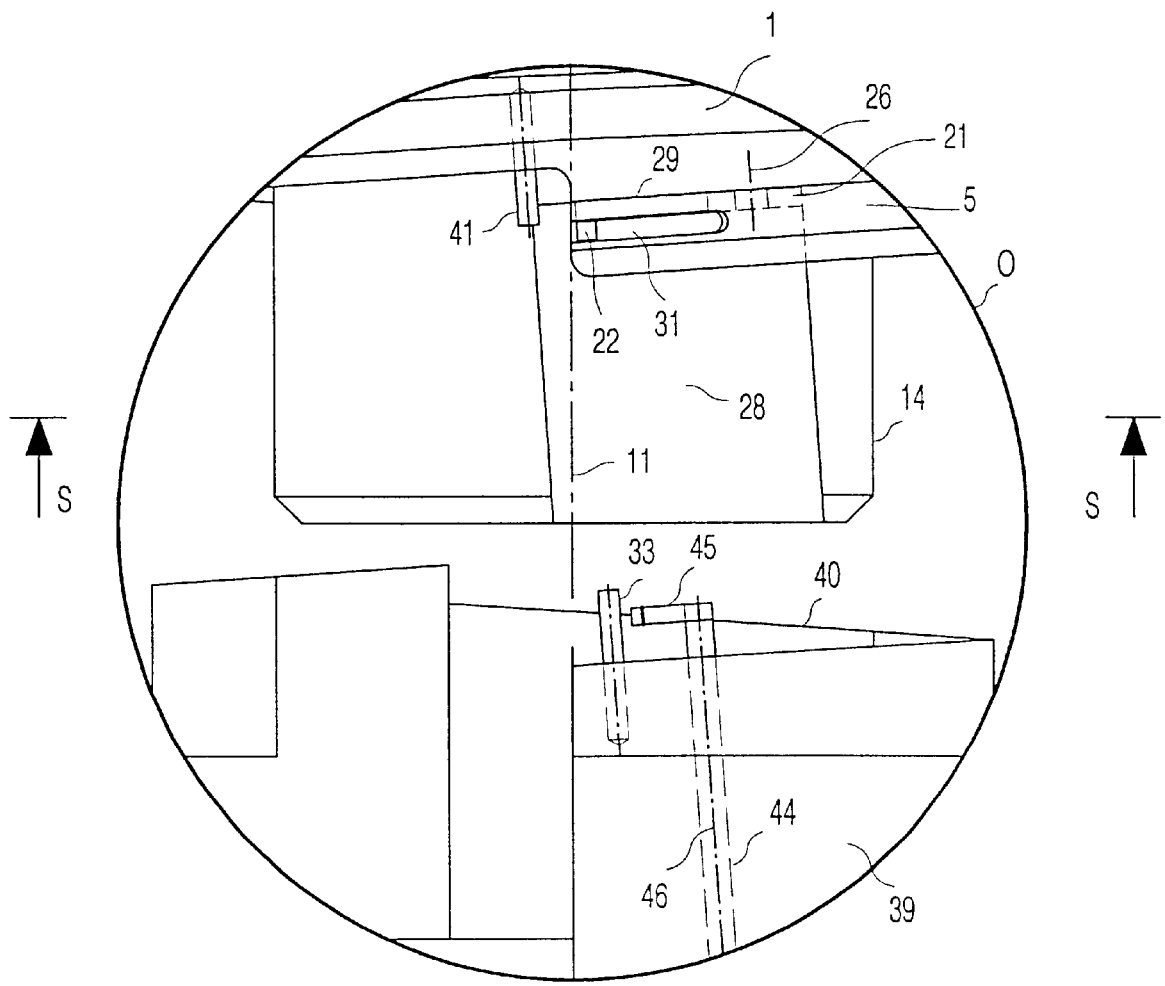
FIG. 22 shows the detail O of FIG. 21 in enlarged representation, FIG. 23 gives a schematic view of an example of embodiment of a device according to the invention for filling and unloading a storage arrangement according to the invention in accordance with the previously described example of embodiment in side view (view P), FIG. 24 gives a schematic sectional view of the device shown in FIG. 23 in front view (view Q), FIG. 25 gives a schematic view of the device shown in FIG. 23 in plan view (view R)

FIG. 21 schematically shows the coupling of a plurality of storage arrangements according to the invention by means of the formation of their inner bodies. For this purpose, the above-described storage arrangement is coupled with its first base-like projecting portion 13 to a second base-like projecting portion 38 of the inner body 36 of a second storage arrangement. Further storage arrangements may basically be connected at will, for example, to a first base-like projecting portion 37 of the inner body 36. FIG. 21 further represents an adapter 39 which has a base-like projecting portion 40 whose shape is provided for accommodating the second base-like projecting portion 14 of the inner body 1. For this purpose, the base-like projecting portion 40 of the adapter 39 at least largely corresponds as regards shape to the shape of the first base-like projecting portion 13 of the inner body 1. FIG. 22 shows this arrangement as an enlarged detail of FIG. 21, while the line of vision of the representations of FIGS. 21 and 22 corresponds to that of FIGS. 1 and 17, respectively. Compared to the embodiment shown in FIG. 17, the locking element is additionally joggled in the direction of the helical axis 11 in the region of the L-shaped bent element 22. For the rest, this version of the locking element 21 corresponds at least essentially to the embodiment already described.

The actuation element 33 is connected in the region of the base-like projecting portion 40 to the adapter 39 and positioned such that when the inner body 1 is coupled to the adapter 39, it is possible to actuate the locking element 21 in the manner described above. The inner body 1 is then turned relative to the adapter 39 through a small angle, for example, about 15° around the helical axis 11. The second base-like projecting portion 40 of the inner body 1 and the base-like projecting portion 40 of the adapter 39 may then have bayonet-fitting catches which are not further shown in FIG. 22. These catches can provide a fixed mechanical locking between the second base-like projecting portion 14 and the base-like projecting portion 40 of the adapter 39 and thus a fixed connection of the inner body 1 to the adapter 39.

FIG. 22 additionally shows a further actuation element 41, which is connected to the inner body 1 in the region of the second base-like projecting portion 14 and preferably has an arrangement corresponding to the actuating element 33 on the adapter 39. A further actuation element 42, corresponding to the actuation element 33 of the adapter 39, is arranged on the inner body I in the region of the first base-like projecting portion 13. Any further storage arrangement has corresponding actuation elements, for example, that referenced 36 in FIG. 21. When the two inner bodies 1, 36 of the storage arrangements are coupled, the locking element in the region of the first base-like projecting portion 13 of the inner body 1 is actuated by the actuating element in the region of the second base-like projecting portion 38 of the inner body 36. Conversely, the locking element in the region of the second base-like projecting portion 38 of the inner body 36 is actuated by the actuation element 42 in the region of the first base-like projecting portion 13 of the inner body 1. When two storage arrangements are coupled, always the channels of the two arrangements are opened or closed simultaneously. Accordingly, the locking element 21 in the region of the second base-like projecting portion 14 of the inner body 1 is actuated by the actuation element 33 whereas, when coupled to the adapter 39, the actuation element 41 in the region of the second base-like projecting portion 14 remains without any effect. The adapter 39, however, is arranged so that the handling is never impeded by the actuation element 41.

The adapter 39 further includes a stop device for interrupting the feeding of components from the channel 2 of the storage arrangement with the inner body 1. This stop device 43 comprises a wave-like part 44 at whose one end a bolt member 45 is arranged in the region of the base-like projecting portion 40 of the adapter 39, which bolt member 45 stretches out at right angles to the axis 46 of the wave-like part 44. The axis 46 of the wave-like part 44 is preferably parallel with the axis 26 of the screw 25 for fastening the locking element 21 to the inner body 1, seen in coupled state of the inner body 1 and the adapter 39. Also the axis of symmetry of the pin-like actuation element 33 of the adapter 39 is aligned in parallel with the axis 46. When the inner body 1 and the adapter 39 are coupled, the end of the wave-like part 44 with the bolt member 45 protrudes into the recess in the inner body 1 to whose bottom face 29 the locking element 21 is fastened. The wave-like part 44 can be turned around its axis 46 by means of a lever 47 and thus the bolt member 45 can be swung horizontally. The recess 31 in the wall portion 30 of the inner body 1 is therefore enlarged in the variant according to FIGS. 21 and 22, so that with this horizontal swing of the bolt member 45, this member cannot be swung into the second end 5 of the channel 2 through the recess 3. The described joggle of the L-shaped bent member 22 of the locking element 21 is used for providing space for the bolt member 45. By the swinging of the bolt member 45, components located at the second end 5 of the channel 2 can be caught between this bolt member and the inside generated surface 16 of the outer body 15 and be impeded in a further movement to the second opening 6. As a result, all the subsequent components in the channel 2 are also impeded when escaping through the second opening 6, whereas components that are already located outside the swinging range of the bolt member 45 may further escape in unimpeded way from the storage arrangement through the second opening 6. If the second end 5 of the channel 2 has been emptied in this manner, more particularly in the region of the L-shaped bent member 22, the locking element 21 can be swung into the second end 5 of the channel 2 with its L-shaped bent member 22 by loosening the coupling between the inner body 1 and the adapter 39 and the storage arrangement can thus be closed. Subsequently, the bolt member 45 can be swung back and release the jammed components.

An example of embodiment for the actuation is described below.

Figure 23:
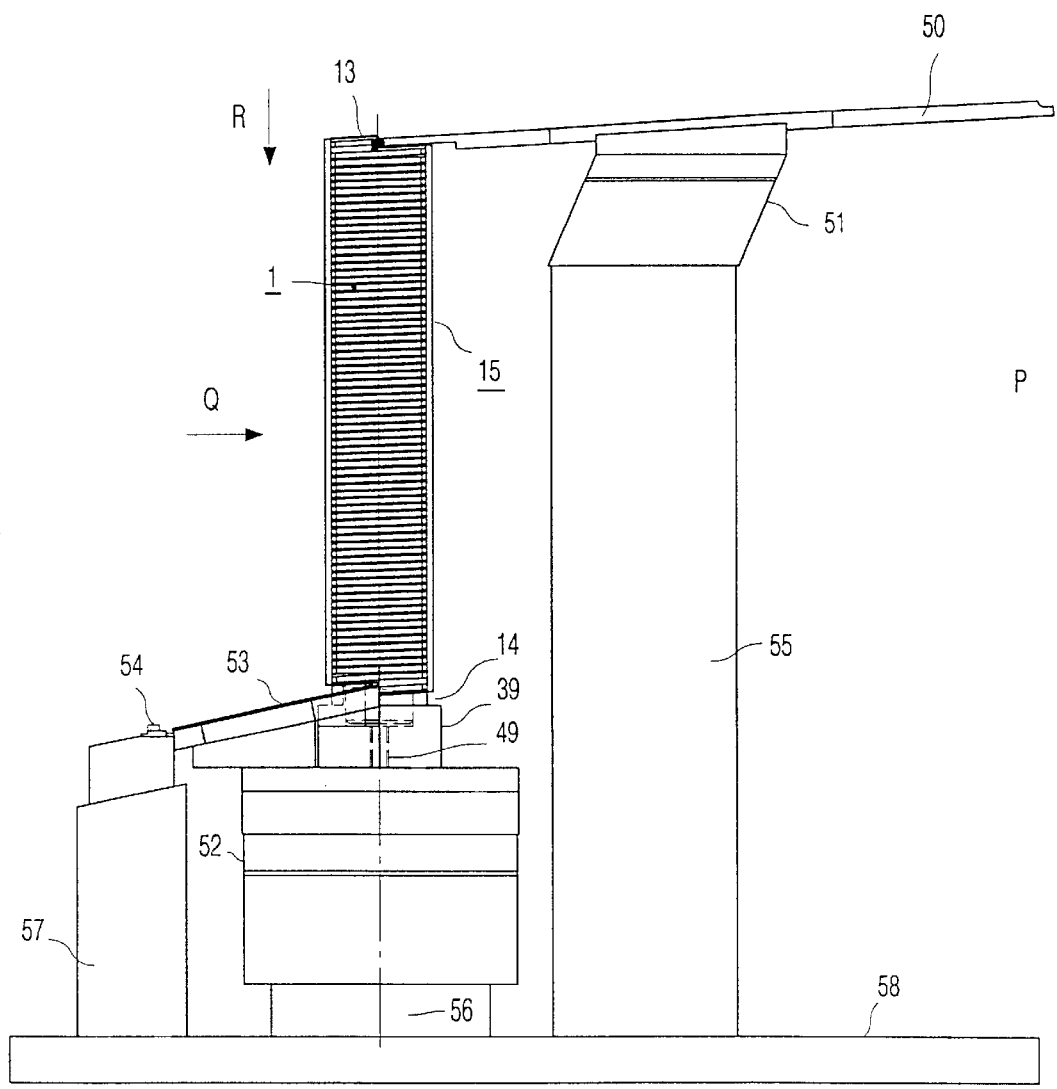
Figure 24:
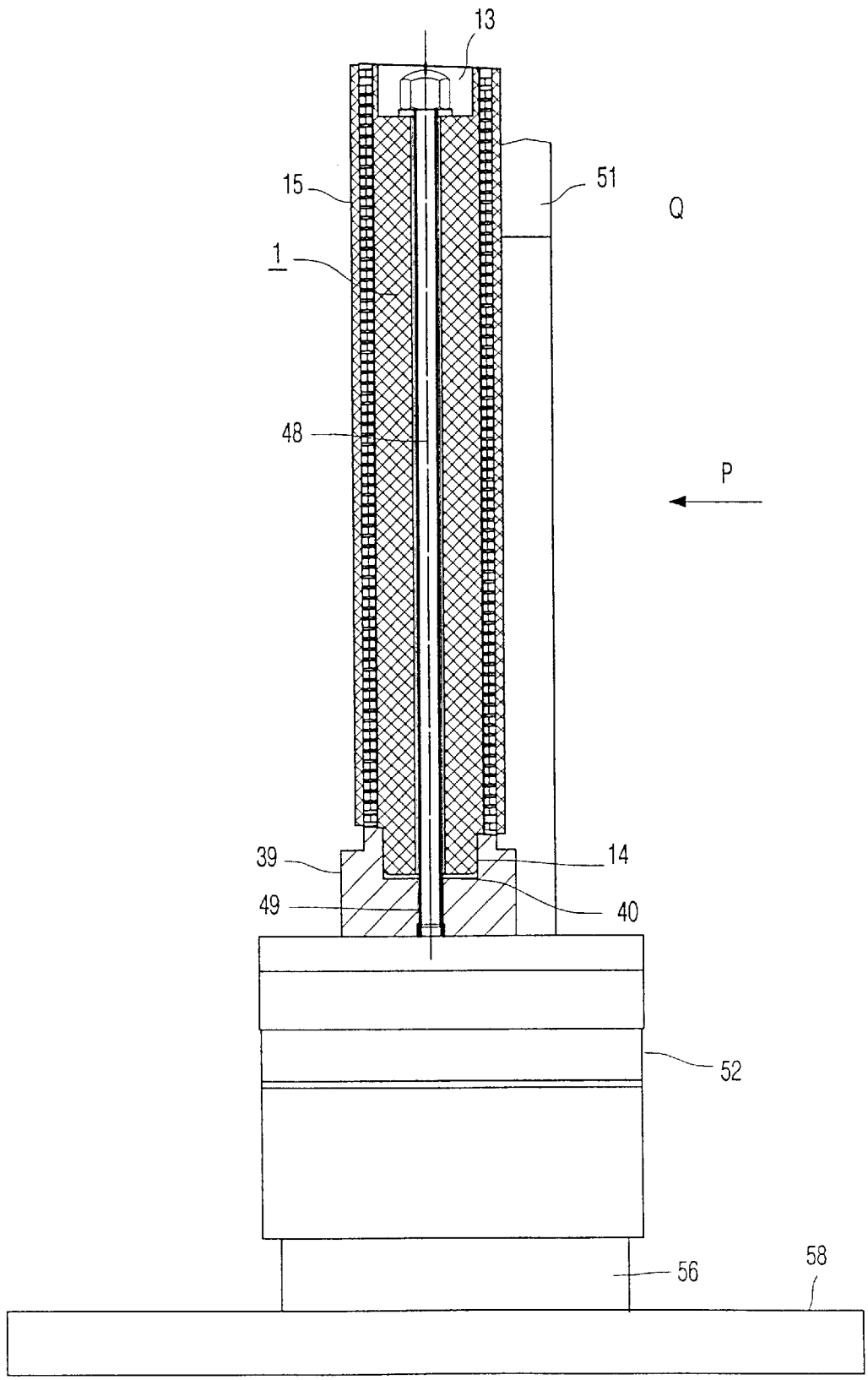
Figure 25:
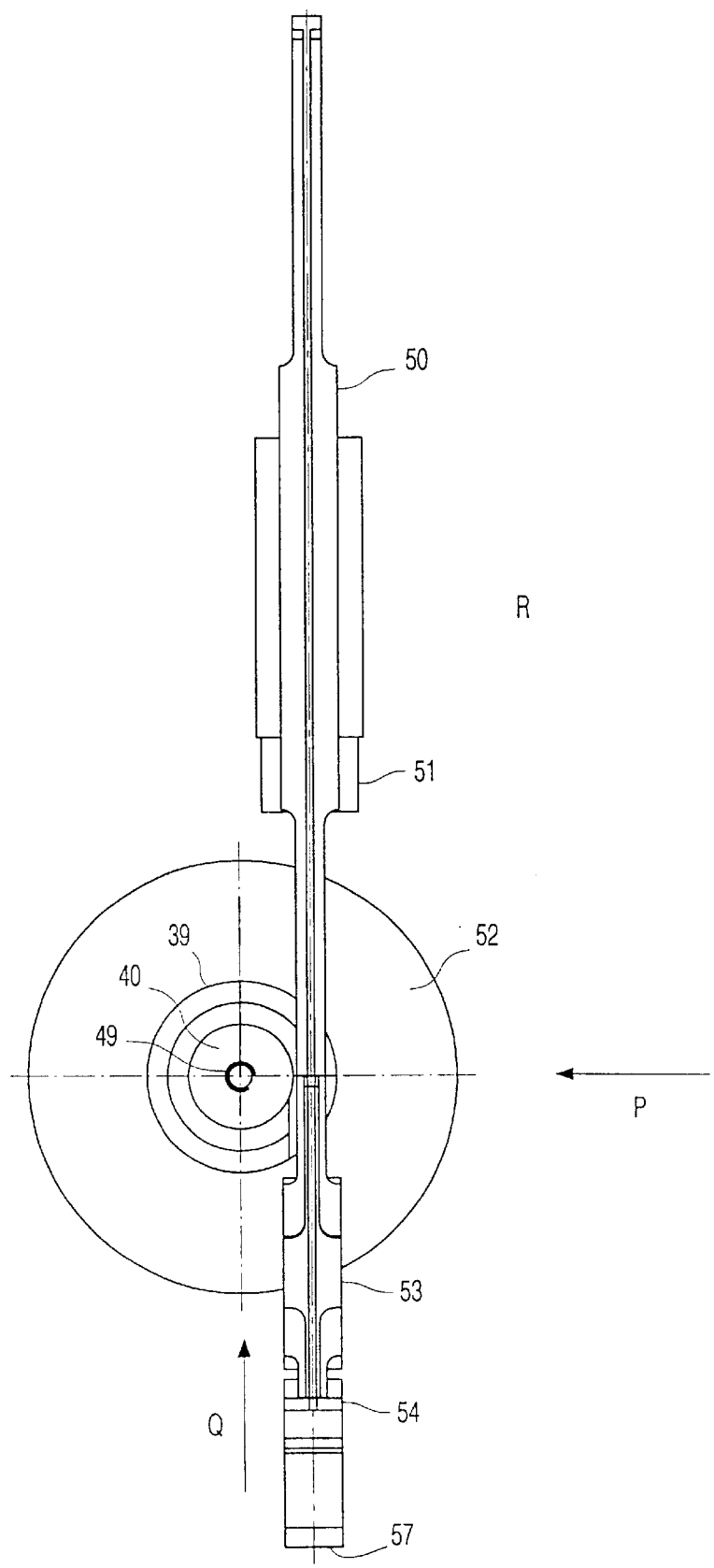

In the three views of FIGS. 23 to 25 is shown an example of embodiment for a device with a described storage arrangement. This device comprises the adapter 39 described above via which the storage arrangement is coupled to the device. For increasing the steadiness of this coupling, more particularly with respect to vibration movements for conveying the components in the storage arrangement, a pin is led concentrically to the helical axis 11 from the first base-like recess 13 through the circular cylindrical recess 12 into an accordingly provided tap hole in the adapter 39 and screwed there. With a bayonet-like arrangement of the base-like projecting portions accordingly mechanically fixed locking of the coupling, the pin 48 and the tap hole 49 in the adapter 39 may be omitted.

The device as shown in FIGS. 23 to 25 comprises a first sub-assembly for filling the storage arrangement 1, 15 with components, and a second sub-assembly for unloading the components from the storage arrangement 1, 15. The first sub-assembly comprises a channel-like feeding element 50 which can be aligned to the first opening 4 of the channel 2 of the storage arrangement 1, 15 for filling the components. This feeding element 50 is fixed to a first vibration device 51 which is, in essence, arranged for a linear vibration movement as a result of which the components are moved along the extension of the feeding element 50 to the storage arrangement 1, 15. To the feeding element 50 may be connected further devices for the production or mass-production of components, which however are not shown.

The first sub-assembly further includes the adapter 39 which is mounted on a second vibration device 52 which is arranged, in essence, for a radial vibration movement. This second vibration device 52 conveys in combination with gravity, the components in the storage arrangement 1, 15 along the channel 2 from the first end 3 to the second end 5. By feeding a respective number of components via the feeding element 50, the elements of the first sub-assembly can fill the storage arrangement 1, 15.

Adapter 39 and the second vibration device 52 at the same time form component parts of a second sub-assembly by which the components can be discharged from the storage arrangement 1, 15. For this purpose, the second sub-assembly further includes a channel-like discharge element 53 which can be aligned to the second opening 6 of the channel 2 of the storage arrangement 1, 15. Through the second opening 6 the components are taken from the storage arrangement 1, 15 and applied, for example, to a chip-mounting machine. This is effected, for example, via a fixed i.e. not connected to one of the vibration devices, receiving device 54, which can be aligned to the channel-like discharge element.

In the example of embodiment of the device as shown in FIGS. 23 to 25, which is shown only diagrammatically, the representation of the locking element on the storage arrangement 1, 15 and actuation elements on the adapter 39 and in the region of the first base-like projecting portion 13 are omitted for clarity. Obviously, an actuation element in accordance with the previous description may be arranged at the coupling location between the feeding element 50 and the first end 3 of the channel 2, for example in combination with a component, which is formed in accordance with the second base-like projecting portion 14 and for filling is inserted in the first base-like projecting portion 13.

In the example of embodiment shown of the device is further arranged the discharge element 53 in combination with the adapter 39 on the second vibration device 52. In a variation of this arrangement, the discharge element 53 may also be connected to a further vibration device which is advantageously again arranged for an essentially linear vibration movement. This slightly more expensive embodiment of the device offers the advantage that the components can be conveyed more easily in the discharge element 53 and thus the gradient of the discharge element 53 between the second opening 6 and the receiving device 54 can be made smaller, because for conveying the components, the influence of gravity need not be used so much. For example, the discharge element 53 may therefore have a longer length.

Besides the combination of vibration movements and gravity, also other driving mechanisms can optionally be used for conveying the components, for example compressed air. In the storage arrangement according to the invention there is a large selection possibility without the limiting necessity of a certain combination of different conveying mechanisms.

For completeness' sake it is stated that in the described example of embodiment, the device for filling and discharging the storage arrangement 1, 15, the vibration devices 51, 52 and the receiving device 54 are fixed via accordingly adapted base-like elements 55, 56 and 57 to a common base plate 58. FIG. 24 shows in view Q a longitudinal section of the storage arrangement 1, 15 and the adapter 39 while the discharge element 53, the receiving device 54 and the base-like element 57 are left out completely and of the first vibration device 51 only the lower part is shown as a broken-away view in which the feeding element 50 is left out. For the rest, the stop device 43 was left out in the representation of FIGS. 23 to 25. Adapter 39, feeding element 50 and discharge element 53 are arranged relative to each other, so that the alignment of the openings 4, 6 of the storage arrangement 1, 15 is effected only by inserting the second base-like projecting portion 14 in the adapter 39.

For the representation of the six working conditions during the handling of the storage arrangement 1, 15 according to the invention at an interruption of the discharge and separation of the storage arrangement from the device described above, a simplified representation is chosen for the locking element 21.

Figure 26:
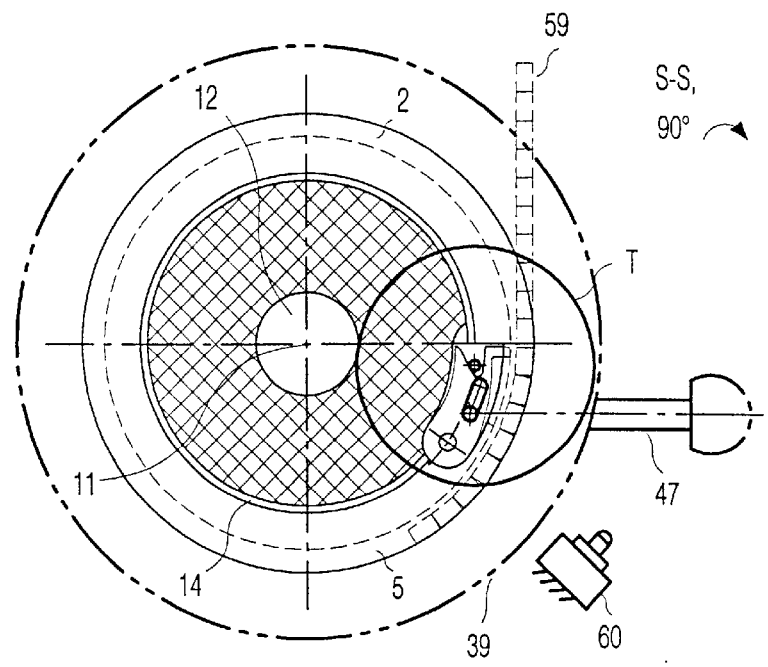
Figure 27:
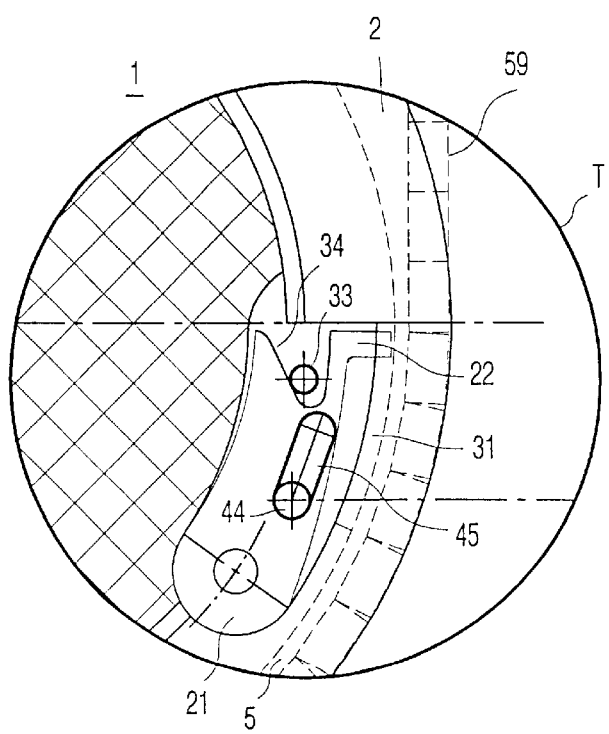

In the first working condition as shown in FIGS. 26 and 27, the locking element is swung in the direction of the helical axis 11. A sequence 59 of chip-like electronic components is taken from the storage arrangement 1, 15 out of the channel 2 via its second end 5 and through the second opening 6, while the second vibration device 52 is in operation. The actuation element 33 of the adapter 39 engages in this first working condition the stop face 34 of the actuator 35 of the locking element 21. The bolt member 45 of the stop device 43 is swung into the direction of the helical axis 11 of the inner body 1 while the lever 47 in the representation of FIGS. 26, 27 is in horizontal position.

Figure 28:
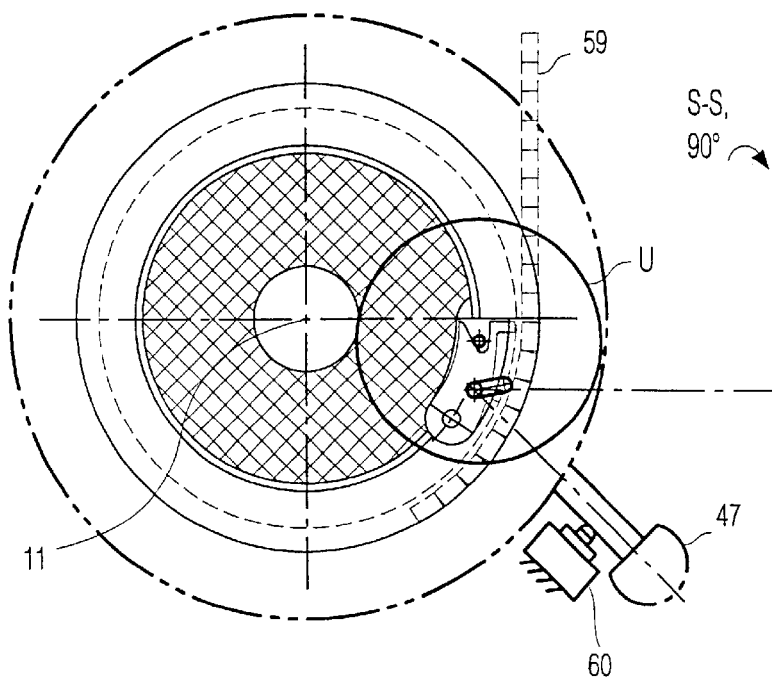
Figure 29:
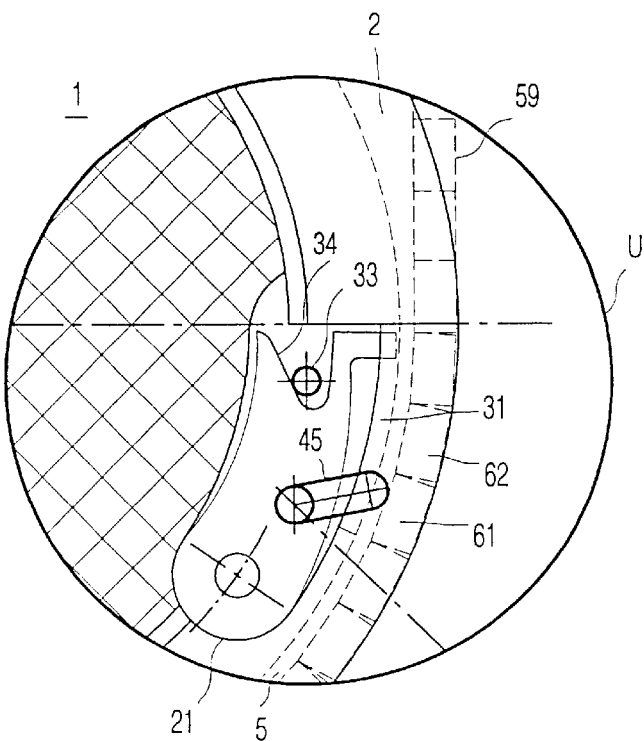

In the second working condition shown in FIGS. 28 and 29, the bolt member 45 of the stop device 43 is swung to a position with the aid of the lever 47, in which the bolt member 45 engages through the recess 31 the second end 5 of the channel 2 and here locks a component 61 in the sequence 59 of components, while the second vibration device 52 continues to be driven in same manner. As a result, not only this component 61, but also all subsequent components in the channel 2 are impeded when they leave the storage arrangement 1, 15. A component 62, lying in the sequence 59 before component 61 in the sequence 59, on the other hand, is unimpeded.

Figure 30:
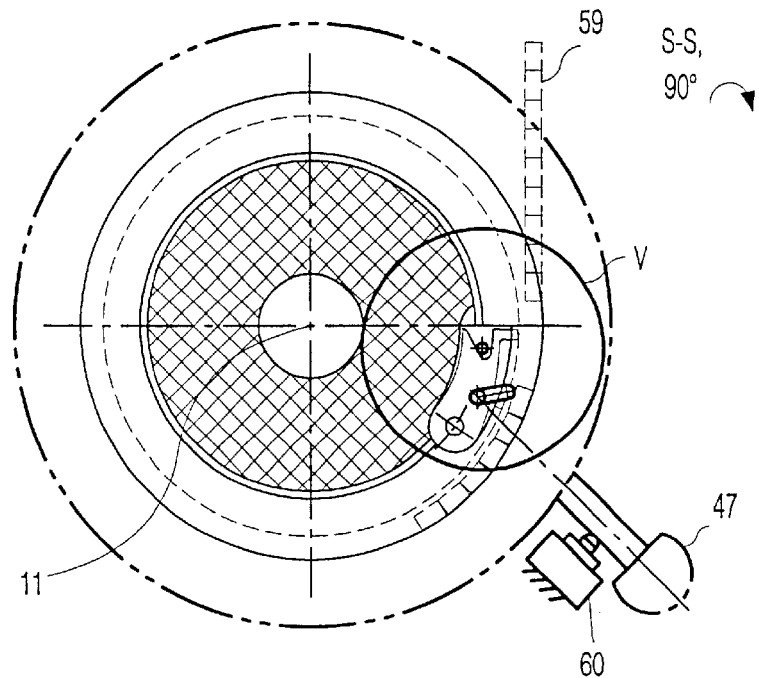
Figure 31:
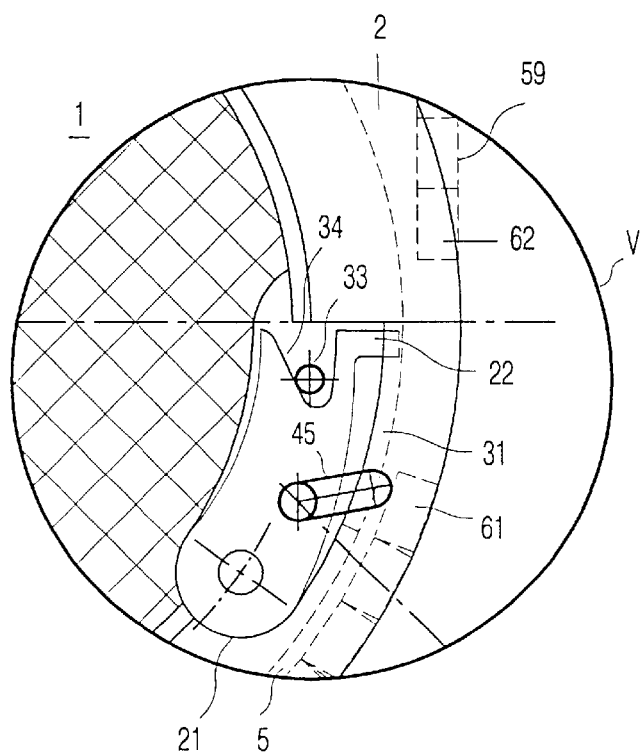

In this working condition the second vibration device 52 is operated until the unimpeded part of the sequence 59 of components with the component 62 as the last one has come out of the second end 5 of the channel 2 through the opening 6. This condition is represented in FIGS. 30 and 31. The second vibration device 52 is now switched off. A gap has now arisen between the components 61 and 62 in the sequence 59.

Between the second working condition shown in FIGS. 28 and 29, on the one hand, and the third working condition shown in FIGS. 30, 31 on the other, there is a period of time during which the last component 62 before the gap developing in the sequence 59 must have left the storage arrangement 1, 15 completely. For automatically adhering to this period of time, a timer may be inserted which, when the lever 47 is swung horizontally and set to the position in accordance with the second working condition, is actuated via a switch 60 and causes the second vibration device 52 to lag behind by said period of time from the instant of this actuation onwards.

Figure 32:
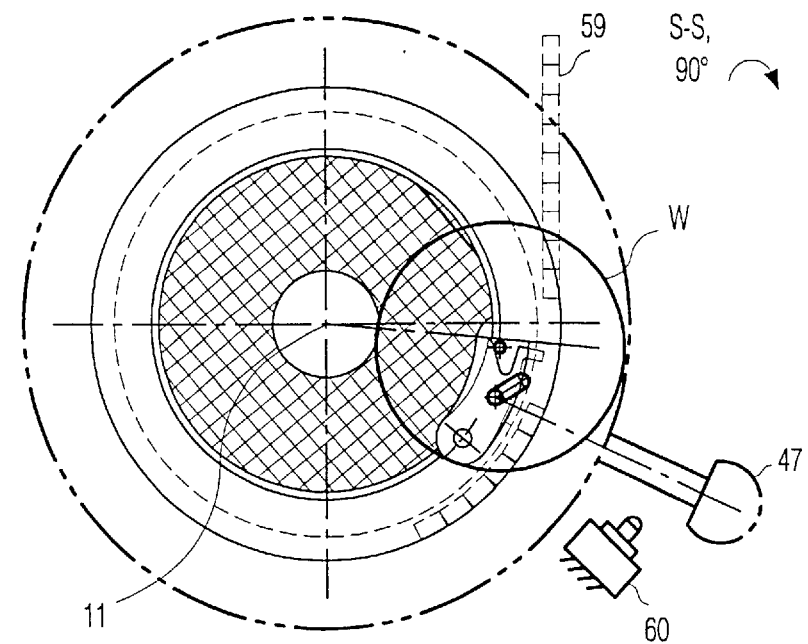
Figure 33:
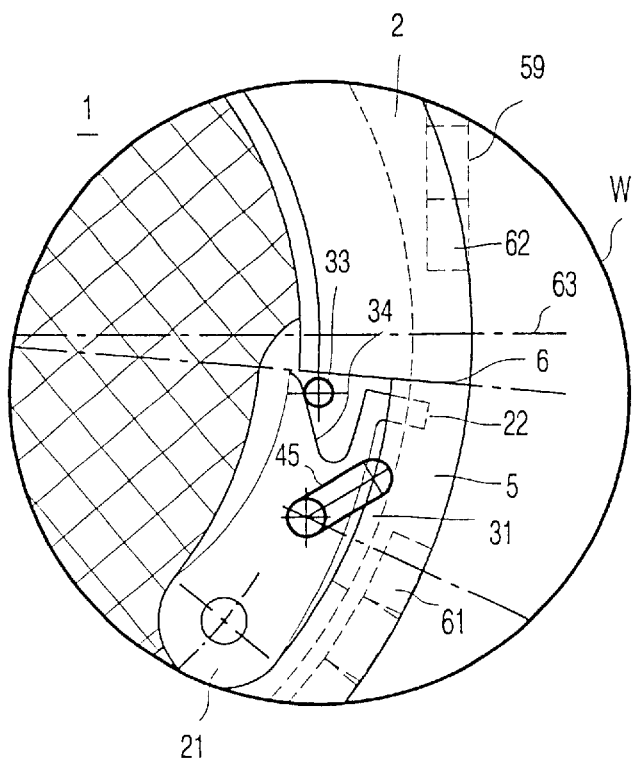

In the fourth working condition shown in FIGS. 32 and 33 a start has been made to turn, after the second vibration device 52 has been switched off, the storage arrangement 1, 15 and thus the second base-like projecting portion 14 relative to the adapter 39 with the actuation element 33 around the helical axis 11. In the selected representation this turning is done clockwise. The original position of the storage arrangement 1, 15 in the first working condition is marked by a line 63.

In the fourth working condition as shown in FIGS. 32 and 33, additionally the lever 47 is swung back by an angle as a result of which the bolt member 45 is swung away from the second end 5 of the channel 2 and releases the previously jammed component 61. By turning the complete storage arrangement 1, 15 around the helical axis 11, however, also the actuation element 33 will glide to the exterior along the stop face 34 of the actuation element extension 35 of the locking element 21 as a result of which the locking element 21 with the L-shaped bent member 22 is swung into the second end 5 of the channel 2. This swing is sufficient for avoiding the component 61 jammed thus far leaving through the opening 6. Furthermore, the switch 60 is again released.

Figure 34:
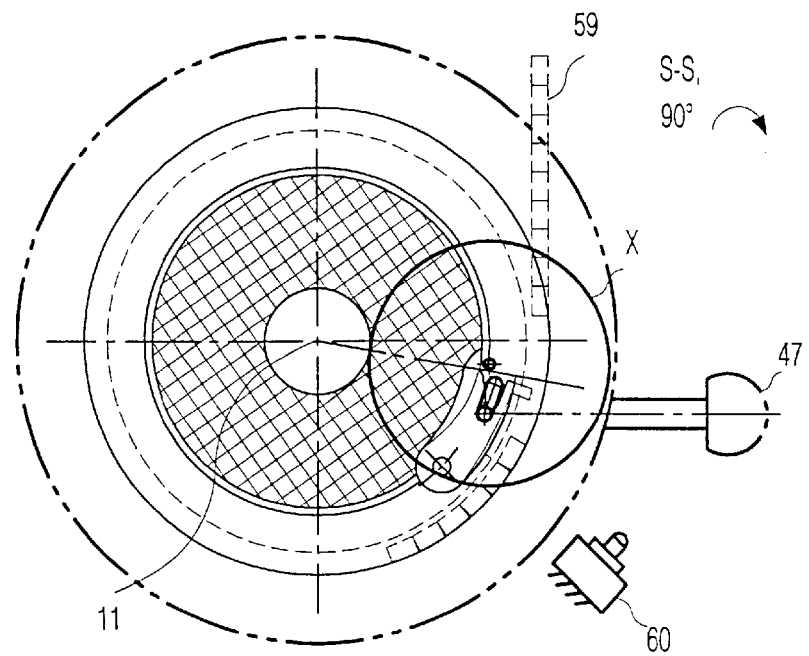
Figure 35:
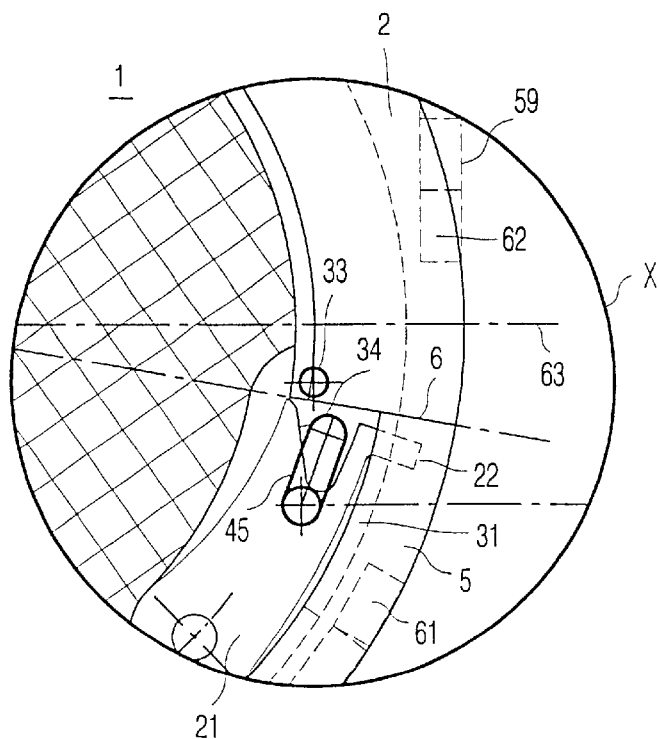
Figure 36:
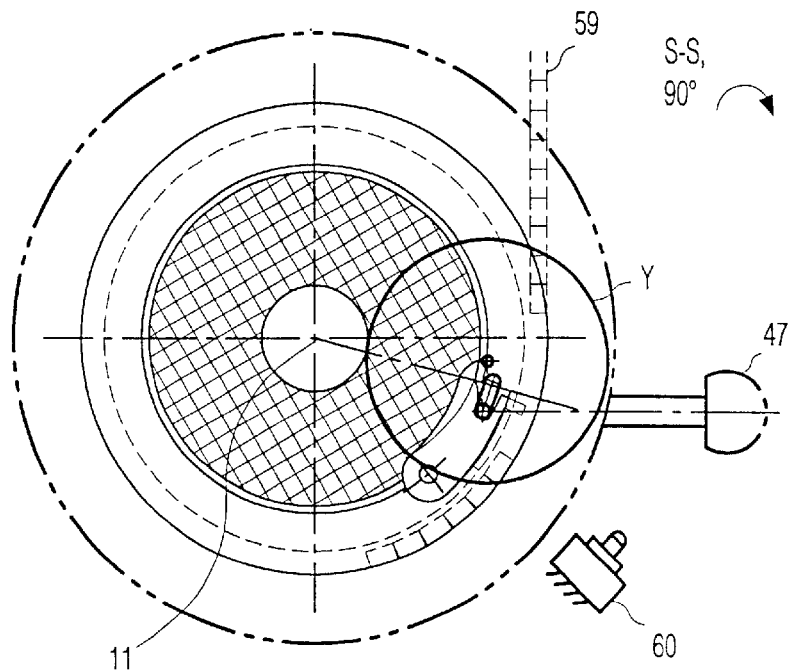
Figure 37:
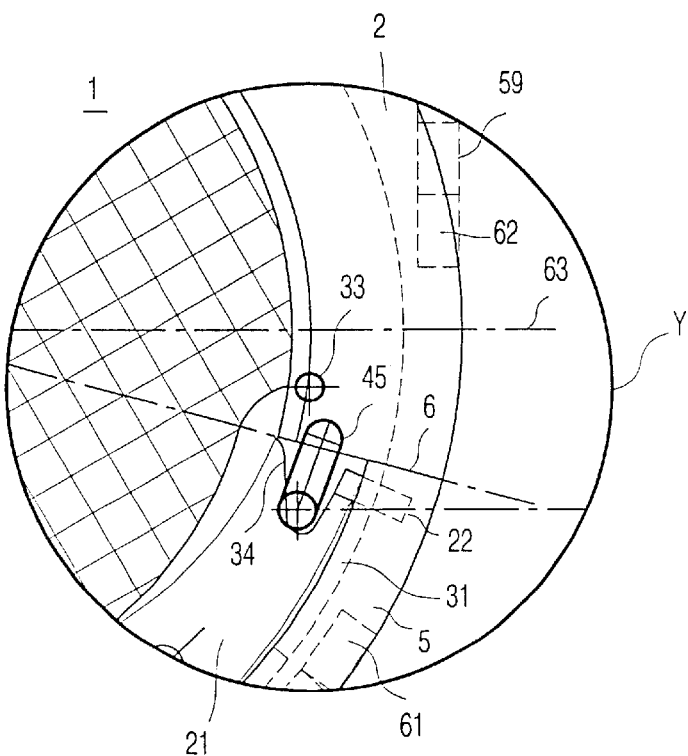

In the fifth working condition shown in FIGS. 34 and 35, the lever 47 has again been swung back to its initial position. Also the bolt member 45 again assumes its initial position. On the other hand, the storage arrangement 1, 15 is moved along in the direction of the rotary movement introduced in the fourth working condition, so that the locking element 21 with its L-shaped bent member 22 is further swung into the second end 5 of the channel 2. In the sixth working condition shown in FIGS. 36 and 37, the rotary movement of the storage arrangement 1, 15 around the helical axis 1 has been completed. The storage arrangement 1, may now be removed from the adapter 39. The locking element 21 is swung out completely and the actuation element 33 is removed from the region of the stop face 34.

With the storage arrangement according to the invention, chip-like electronic components can be stored and produced again without any losses, but also mechanically similar products of different type, while they keep the same order and alignment. The storage arrangement according to the invention serves as a container for protecting the products during transport and storage. Filling the storage arrangement partly with products and partly taking products from the storage arrangement is possible without loss of products. The storage arrangement is furthermore reusable. More particularly, type and quantity of the contents of the storage arrangement can easily be recognized with a transparent outer body. The storage arrangement works as a type of FIFO memory. By respectively selecting the materials for the inner body and the outer body, not only a mechanical, but also an electrostatic and, if necessary, magnetic protection of the stored products can be obtained. Closing the channel by locking elements on both ends is not only used to avoid loss of products, but also as a protection against contaminations. The outside surface especially of the outer body enables in a simple manner to apply marks that feature the stored products and their use. With the storage arrangement according to the invention it is possible with a simple operation to have fast interruptions of the loading and unloading activities without a loss of products and with the least handling cost. More particularly, compared to a storage of components on tapes, complicated threading and winding operations are saved on. The design according to which the channel is led along a helical line provides a high mechanical stability.

What is claimed is:

1. Storage arrangement comprising a channel for accommodating chip-like electronic components in predefined order and alignment, wherein the channel between a first and a second end is at least largely led along a helical line, the channel is connected to the exterior of the storage arrangement by means of an opening at least one of its ends, a first opening at a first one of the ends of the channel is provided for filling the storage arrangement with components and a second opening at a second one of the ends of the channel is provided for unloading the components from the storage arrangement, a first base-like projecting portion is provided in the region of the first end of the channel and a second base-like projecting portion is provided in the region of the second end of the channel, which base-like projecting portions are each other's complement, and the second base-like projecting portion of a first storage arrangement can be joined to the first base-like projecting portion of a second storage arrangement for connecting the second opening at the second end of the channel of the first storage arrangement to the first opening at the first end of the channel of the second storage arrangement for the components to pass through.

2. A storage arrangement as claimed in claim 1, characterized in that the channel runs, in essence, along a cylindrical helical line.

3. A storage arrangement as claimed in claim 1, characterized in that the channel runs, in essence, along a circular cylindrical helical line.

4. A storage arrangement as claimed in claim 1, characterized by an, in essence, bayonet-catch design of the first and second base-like projecting portions.

5. A device with a storage arrangement as claimed in claim 1, in which the first base-like projecting portion of the storage arrangement can be coupled to a first sub-assembly for preferably filling the storage arrangement with components, which first sub-assembly has a channel-like feeding element that can be aligned to the first opening of the channel of the storage arrangement.

6. A device as claimed in claim 5, characterized in that the feeding element is coupled to a first vibration device in essence arranged for a linear vibration movement.

7. A storage arrangement as claimed in claim 1, characterized in that the channel is led over its entire length along a circular cylindrical helical line whose pitch between the regions around the ends of the channel has an in essence first value and whose pitch in the region of the ends of the channel has an increased second value compared to this first value.

8. A storage arrangement as claimed in claim 2, in which the channel over its entire length is led along a cylindrical helical line, characterized by a construction with a cylindrical inner body which inner body has an outside generated surface with which it is inserted into a cylindrical outer body along an inside generated surface of this outer body, while the generated surfaces at least largely have mutually adapted contours.

9. A storage arrangement as claimed in claim 8, characterized in that the channel is embedded in the inner body at least largely along the outside generated surface of the inner body.

10. A storage arrangement as claimed in claim 8, characterized in that the first and second base-like projecting portions of the storage arrangement are adapted to the inner body at least to a considerable extent.

11. A storage arrangement as claimed in claim 8, characterized in that the outer body is formed at least in sections of an at least substantially transparent material.

12. A storage arrangement as claimed in claim 1, characterized in that the openings having each a locking element are provided to avoid components included thereincoming out.

13. A storage arrangement as claimed in claim 12, characterized in that the locking elements are spring-mounted.

14. A storage arrangement as claimed in claim 12, characterized by a respective actuation element provided at each base-like projecting portion, by which element the locking element can be actuated in the region of the complementarily arranged base-like projecting portion of a further storage arrangement when these two storage arrangements are joined in that the channel is opened.

15. A device with a storage arrangement as claimed in claim 1, in which the second base-like projecting portion can be coupled to a second sub-assembly for preferably unloading the components, which second sub-assembly has a channel-like discharge element that can be aligned to the second opening of the channel of the storage arrangement.

16. A device as claimed in claim 15, characterized in that a base-like projecting portion whose shape for accommodating the second base-like projecting portion of the storage arrangement at least largely corresponds to the shape of the first base-like projecting portion of the storage arrangement.

17. A device as claimed in claim 16, characterized in that the base-like projecting portion of the device and the discharge element are jointly coupled to a second vibration device in essence provided for a radial vibration movement.

18. A device as claimed in claim 16 including a storage arrangement as claimed in claim 7, characterized in that the base-like projecting portion of the device includes an actuating element by which the locking element in the region of the second opening of the channel of the storage arrangement can be actuated in that the channel can be opened when the second base-like projecting portion of a storage arrangement is joined to the base-like projecting portion of the device.

19. A device as claimed in claim 15, characterized by a stop device for interrupting the feeding of components from the channel of a coupled storage arrangement.

20. A device as claimed in claim 16, characterized by an in essence bayonet-catch shape of the base-type projecting portion of the device.

* * * * *